US012772600B2

(12) United States Patent
Kotov et al.

(10) Patent No.: US 12,772,600 B2
(45) Date of Patent: Oct. 20, 2026

(54) LEAD CHALCOGENIDE NANOCRYSTALLINE SEMICONDUCTOR SYNTHESIS AND RADIATION DETECTION

(71) Applicant: The Regents of the University of Michigan, Ann Arbor, MI (US)

(72) Inventors: Nicholas Kotov, Ann Arbor, MI (US); Drew Vecchio, Ann Arbor, MI (US); Brandon Davis, Ann Arbor, MI (US); Mark Hammig, Dexter, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 444 days.

(21) Appl. No.: 18/218,360

(22) Filed: Jul. 5, 2023

(65) Prior Publication Data

US 2024/0014337 A1 Jan. 11, 2024

Related U.S. Application Data

(60) Provisional application No. 63/358,420, filed on Jul. 5, 2022.

(51) Int. Cl.

| | |
|---|---|
| ***H10F 77/162*** | (2025.01) |
| ***G01T 1/24*** | (2006.01) |
| ***H10F 30/00*** | (2025.01) |
| ***H10F 71/00*** | (2025.01) |
| ***H10F 77/12*** | (2025.01) |

(52) U.S. Cl.

CPC ........... *H10F 77/162* (2025.01); *G01T 1/241* (2013.01); *H10F 30/301* (2025.01); *H10F 71/00* (2025.01); *H10F 77/127* (2025.01)

(58) Field of Classification Search

CPC ...... H10F 30/301; H10F 71/00; H10F 77/127; H10F 77/1433; H10F 77/162; G01T 1/24; G01T 1/241

See application file for complete search history.

(56) References Cited

U.S. PATENT DOCUMENTS

| | | | | |
|---|---|---|---|---|
| 9,887,309 | B2 * | 2/2018 | Shi | H10F 10/14 |
| 10,297,707 | B1 * | 5/2019 | Globus | H10F 10/164 |
| 2009/0217967 | A1 * | 9/2009 | Hovel | B82Y 20/00 438/73 |

(Continued)

OTHER PUBLICATIONS

G. Kim, J. Huang and M. D. Hammig, "An Investigation of Nanocrystalline Semiconductor Assemblies as a Material Basis for Ionizing-Radiation Detectors," in IEEE Transactions on Nuclear Science, vol. 56, No. 3, pp. 841-848, Jun. 2009 (Year: 2009).*

(Continued)

*Primary Examiner* — David J Makiya
*Assistant Examiner* — Soorena Kefayati
(74) *Attorney, Agent, or Firm* — Lempia Summerfield Katz LLC

(57) ABSTRACT

A device for radiation detection includes a first electrode, a second electrode spaced apart from the first electrode, and a macroscale structure disposed between the first electrode and the second electrode. The macroscale structure comprises a composite arrangement of nanocrystalline particles. The nanocrystalline particles comprise a lead chalcogenide material. The nanocrystalline particles establish conductive paths between the first electrode and the second electrode without an intervening conductive polymer agent.

16 Claims, 14 Drawing Sheets

(56) References Cited

U.S. PATENT DOCUMENTS

| | | | | |
|---|---|---|---|---|
| 2010/0044676 | A1* | 2/2010 | Sargent | B82Y 20/00 257/21 |
| 2010/0139770 | A1* | 6/2010 | Scher | B82Y 10/00 136/252 |
| 2010/0283036 | A1* | 11/2010 | Coe-Sullivan | H05B 33/145 257/13 |
| 2013/0026445 | A1* | 1/2013 | Parsapour | H10F 71/00 257/14 |
| 2015/0162556 | A1* | 6/2015 | Friend | H10F 71/00 136/258 |
| 2015/0340525 | A1* | 11/2015 | Oueslati | H10F 71/00 438/95 |
| 2019/0006541 | A1* | 1/2019 | So | C01B 19/007 |
| 2020/0318255 | A1* | 10/2020 | Lhuillier | C30B 29/46 |
| 2022/0085225 | A1* | 3/2022 | Guyot-Sionnest | C09K 11/892 |

OTHER PUBLICATIONS

Brandon J. Davis and Mark D. Hammig ACS Applied Nano Materials 2021 4 (7), 6936-6946 (Year: 2021).*
Arachchige, I. U.; Brock, S. L. Highly Luminescent Quantum-Dot Monoliths. J. Am. Chem. Soc. 2007, 129 (7), 1840-1841.
Arachchige, I. U.; Brock, S. L. Sol-Gel Assembly of CdSe Nanoparticles to Form Porous Aerogel Networks. J. Am. Chem. Soc. 2006, 128 (24), 7964-7971.
Baumann et al., "Facile Synthesis of a Crystalline, High-Surface-Area SnO2 Aerogel", Adv. Mater. 2005, 17, 1546-1548.
Berestok, T.; Guardia, P.; Du, R.; Portals, J. B.; Colombo, M.; Estrade, S.; Peiro, F.; Brock, S. L.; Cabot, A. Metal Oxide Aerogels with Controlled Crystallinity and Faceting from the Epoxide-Driven Cross-Linking of Colloidal Nanocrystals. ACS Appl. Mater. Interfaces 2018, 10 (18), 16041-16048.
Bigall, N. C.; Herrmann, A.; Vogel, M.; Rose, M.; Simon, P.; Carrillo-Cabrera, W.; Dorfs, D.; Kaskel, S.; Gaponik, N.; Eychmüller, A. Hydrogels and Aerogels from Noble Metal Nanoparticles. Angew. Chemie Int. Ed. 2009, 48 (51), 9731-9734.
Bonn, D.; Kellay, H.; Tanaka, H.; Wegdam, G.; Meunier, J. Laponite: What Is the Difference between a Gel and a Glass? Langmuir 1999, 15 (22), 7534-7536.
Cai, B.; Eychmüller, A. Promoting Electrocatalysis upon Aerogels. Adv. Mater. 2019, 31 (31), 1804881.
Davis, B. J.; Hammig, M. D. PbSe Quantum Dots for X-Ray and γ-Ray Sensors. ACS Appl. Nano Mater. 2021, 4 (7), 6936-6946.
Dementjev, A.; Gulbinas, V.; Valkunas, L.; Raaben, H., Nonlinear absorption of PbS nanocrystals in silicate glass. physica status solidi (b) 2004, 241 (4), 945-951.
Eom, W.; Park, H.; Noh, S. H.; Koh, K. H.; Lee, K.; Lee, W. J.; Han, T. H. Strengthening and Stiffening Graphene Oxide Fiber with Trivalent Metal Ion Binders. Part. Part. Syst. Charact. 2017, 34 (9), 1600401.
Estrada et al., "What is the meaning of the graph energy after all?", Discret. Appl. Math. 2017, 230, 71.
Eychmüller, A. Aerogels from Semiconductor Nanomaterials. Angew. Chemie Int. Ed. 2005, 44 (31), 4839-4841.
Freytag et al., "Versatile Aerogel Fabrication by Freezing and Subsequent Freeze-Drying of Colloidal Nanoparticle Solutions", Angew. Chem. Int. Ed. 2016, 55, 1200-1203.
Freytag, A.; Colombo, M.; Bigall, N. C. Catalytic Properties of Cryogelated Noble Metal Aerogels. Zeitschrift für Phys. Chemie 2017, 231 (1), 63-75.
Ganguly et al., "Toward nanostructured thermoelectrics: synthesis and characterization of lead telluride gels and aerogels", J. Mater. Chem., 2011, 21, 8800-8806.
Ganguly, S.; Zhou, C.; Morelli, D.; Sakamoto, J.; Brock, S. L. Synthesis and Characterization of Telluride Aerogels: Effect of Gelation on Thermoelectric Performance of Bi2Te3 and Bi2-x Sb x Te3 Nanostructures. J. Phys. Chem. C 2012, 116 (33), 17431-17439.
Gao, F.; Lu, Q.; Liu, X.; Yan, Y.; Zhao, D., Controlled Synthesis of Semiconductor PbS Nanocrystals and Nanowires Inside Mesoporous Silica SBA-15 Phase. Nano Letters 2001, 1 (12), 743-748.
Gao, F.; Lu, Q.; Xie, S.; Zhao, D., A Simple Route for the Synthesis of Multi-Armed CdS Nanorod-Based Materials. Advanced Materials 2002, 14 (21), 1537-1540.
Gaponik, N.; Herrmann, A.-K.; Eychmüller, A. Colloidal Nanocrystal-Based Gels and Aerogels: Material Aspects and Application Perspectives. J. Phys. Chem. Lett. 2012, 3 (1), 8-17.
Geuchies, J. J.; van Overbeek, C.; Evers, W. H.; Goris, B.; de Backer, A.; Gantapara, A. P.; Rabouw, F. T.; Hilhorst, J.; Peters, J. L.; Konovalov, O.; Petukhov, A. V.; Dijkstra, M.; Siebbeles, L. D. A.; van Aert, S.; Bals, S.; Vanmaekelbergh, D., In situ study of the formation mechanism of two-dimensional superlattices from PbSe nanocrystals. Nature Materials 2016, 15 (12), 1248-1254.
Gholamrezaei, S.; Salavati-Niasari, M.; Bazarganipour, M.; Panahi-Kalamuei, M.; Bagheri, S. Novel Precursors for Synthesis of Dendrite-like PbTe Nanostructures and Investigation of Photoluminescence Behavior. Adv. Powder Technol. 2014, 25 (5), 1585-1592.
Grzelczak, M.; Vermant, J.; Furst, E. M.; Liz-Marzán, L. M. Directed Self-Assembly of Nanoparticles. ACS Nano 2010, 4 (7), 3591-3605.
Guo et al., "A self-assembled hierarchical nanostructure comprising carbon spheres and graphene nanosheets for enhanced supercapacitor performance", Energy Environ. Sci., 2011, 4, 4504.
Hammig, M. D.; Kang, T.; Jeong, M.; Jarrett, M. Suppression of Interface-Induced Noise by the Control of Electron-Phonon Interactions. IEEE Trans. Nucl. Sci. 2013, 60 (4), 2831-2839.
Hammig, M. D.; Kang, T.; Jeong, M.; Jarrett, M., In Suppression of interface-induced noise by the control of electron-phonon interactions, 2012 IEEE Nuclear Science Symposium and Medical Imaging Conference Record (NSS/MIC), Oct. 27-Nov. 3, 2012; 2012; pp. 4188-4195.
Hendricks et al., "A tunable library of substituted thiourea precursors to metal sulfide nanocrystals," Science 2015, 348 (6240), 1226-1230.
Herrmann, A.-K.; Formanek, P.; Borchardt, L.; Klose, M.; Giebeler, L.; Eckert, J.; Kaskel, S.; Gaponik, N.; Eychmüller, A. Multimetallic Aerogels by Template-Free Self-Assembly of Au, Ag, Pt, and Pd Nanoparticles. Chem. Mater. 2014, 26 (2), 1074-1083.
Hewa-Rahinduwage, C. C.; Silva, K. L.; Brock, S. L.; Luo, L. Quantum Dot Assembly Driven by Electrochemically Generated Metal-Ion Crosslinkers. Chem. Mater. 2021.
Hirai et al., "Coordination Assembly of Discoid Nanoparticles", Angew. Chem. Int. Ed. 2015, 54, 8966 -8970.
Huang, T.; Zhao, Q.; Xiao, J.; Qi, L., Controllable Self-Assembly of PbS Nanostars into Ordered Structures: Close-Packed Arrays and Patterned Arrays. ACS Nano 2010, 4 (8), 4707-4716.
Ivan Gutman, "The Energy of a Graph: Old and New Results", Algebraic Combinatorics and Applications, pp. 196-211, 2001.
Jeong, S.-H.; Lee, J. W.; Ge, D.; Sun, K.; Nakashima, T.; Yoo, S. II; Agarwal, A.; Li, Y.; Kotov, N. A. Reversible Nanoparticle Gels with Colour Switching. J. Mater. Chem. 2011, 21 (31), 11639-11643.
Joglekar, S. G.; Hammig, M. D.; Guo, L. J. High-Energy Photon Spectroscopy Using All Solution-Processed Heterojunctioned Surface-Modified Perovskite Single Crystals. ACS Appl. Mater. Interfaces 2019, 11 (36), 33399-33408.
Jun, Y.-w.; Lee, S.-M.; Kang, N.-J.; Cheon, J., Controlled Synthesis of Multi-armed CdS Nanorod Architectures Using Monosurfactant System. Journal of the American Chemical Society 2001, 123 (21), 5150-5151.
Kim et al., "Charge Transport Dilemma of Solution-Processed Assemblies of Nanoparticles", Chem. Mater. 2014, 26, 1, 134-152.
Kim, G.; Hammig, M. D., Development of lead chalcogenide nanocrystalline (NC) semiconductor ionizing radiation detectors, 2009 IEEE Nuclear Science Symposium Conference Record (NSS/MIC), Oct. 24-Nov. 1, 2009; 2009; pp. 1317-1320.
Kim, G.; Huang, J.; Hammig, M. D., An Investigation of Nanocrystalline Semiconductor Assemblies as a Material Basis for Ionizing-Radiation Detectors. IEEE Transactions on Nuclear Science 2009, 56 (3), 841-848.

(56) References Cited

OTHER PUBLICATIONS

Kuang, D.; Xu, A.; Fang, Y.; Liu, H.; Frommen, C.; Fenske, D., Surfactant-Assisted Growth of Novel PbS Dendritic Nanostructures via Facile Hydrothermal Process. Advanced Materials 2003, 15 (20), 1747-1750.
Kwon, I.; Kang, T.; Hammig, M. D., Experimental Validation of Charge-Sensitive Amplifier Configuration that Compensates for Detector Capacitance. IEEE Transactions on Nuclear Science 2016, 63 (2), 1202-1208.
Kwon, I.; Kang, T.; Wells, B. T.; D'Aries, L. J.; Hammig, M. D., Compensation of the detector capacitance presented to charge-sensitive preamplifiers using the Miller effect. Nuclear Instruments and Methods in Physics Research Section A: Accelerators, Spectrometers, Detectors and Associated Equipment 2015, 784, 220-225.
Leontidis, E.; Orphanou, M.; Kyprianidou-Leodidou, T.; Krumeich, F.; Caseri, W., Composite Nanotubes Formed by Self-Assembly of PbS Nanoparticles. Nano Letters 2003, 3 (4), 569-572.
Lin et al., "Universality in Colloid Aggregation", Letters to Nature, vol. 339, pp. 360-362, Jun. 1, 1989.
Liu, W.; Herrmann, A.-K.; Bigall, N. C.; Rodriguez, P.; Wen, D.; Oezaslan, M.; Schmidt, T. J.; Gaponik, N.; Eychmüller, A. Noble Metal Aerogels—Synthesis, Characterization, and Application as Electrocatalysts. Acc. Chem. Res. 2015, 48 (2), 154-162.
Lu, Q.; Gao, F.; Zhao, D., Creation of a Unique Self-Supported Pattern of Radially Aligned Semiconductor Ag2S Nanorods. Angewandte Chemie International Edition 2002, 41 (11), 1932-1934.
Lu, Q.; Gao, F.; Zhao, D., One-Step Synthesis and Assembly of Copper Sulfide Nanoparticles to Nanowires, Nanotubes, and Nanovesicles by a Simple Organic Amine-Assisted Hydrothermal Process. Nano Letters 2002, 2 (7), 725-728.
Lyu, J.; Hammig, M. D.; Liu, L.; Xu, L.; Chi, H.; Uher, C.; Li, T.; Kotov, N. A., Stretchable conductors by kirigami patterning of aramid-silver nanocomposites with zero conductance gradient. 2017, 111 (16), 161901.
Lyu, J.; Wang, X.; Liu, L.; Kim, Y.; Tanyi, E. K.; Chi, H.; Feng, W.; Xu, L.; Li, T.; Noginov, M. A.; Uher, C.; Hammig, M. D.; Kotov, N. A., High Strength Conductive Composites with Plasmonic Nanoparticles Aligned on Aramid Nanofibers. 2016, 26 (46), 8435-8445.
Ma, C.; Moore, D.; Li, J.; Wang, Z. L., Nanobelts, Nanocombs, and Nanowindmills of Wurtzite ZnS. Advanced Materials 2003, 15 (3), 228-231.
Mark D. Hammig; Nanoscale Methods to Enhance the Detection of Ionizing Radiation, Current Topics in Ionizing Radiation Research, InTech, 2012, 24 pp.
Matter, F.; Luna, A. L.; Niederberger, M. From Colloidal Dispersions to Aerogels: How to Master Nanoparticle Gelation. Nano Today 2020, 30, 100827.
McDonald, S. A.; Konstantatos, G.; Zhang, S.; Cyr, P. W.; Klem, E. J. D.; Levina, L.; Sargent, E. H., Solution-processed PbS quantum dot infrared photodetectors and photovoltaics. Nature Materials 2005, 4 (2), 138-142.
Mohanan, J. L.; Arachchige, I. U.; Brock, S. L. Porous Semiconductor Chalcogenide Aerogels. Science (80-. ). 2005, 307 (5708), 397-400.
Murphy, J. E.; Beard, M. C.; Norman, A. G.; Ahrenkiel, S. P.; Johnson, J. C.; Yu, P.; Mićić, O. I.; Ellingson, R. J.; Nozik, A. J. PbTe Colloidal Nanocrystals: Synthesis, Characterization, and Multiple Exciton Generation. J. Am. Chem. Soc. 2006, 128 (10), 3241-3247.
Myadam, N. L.; Nadargi, D. Y.; Nadargi, J. D. G.; Shaikh, F. I.; Suryavanshi, S. S.; Chaskar, M. G. A Facile Approach of Developing Al/SnO2 Xerogels via Epoxide Assisted Gelation: A Highly Versatile Route for Formaldehyde Gas Sensors. Inorg. Chem. Commun. 2020, 116, 107901.
Ni, Y.; Liu, H.; Wang, F.; Liang, Y.; Hong, J.; Ma, X.; Xu, Z., Shape Controllable Preparation of PbS Crystals by a Simple Aqueous Phase Route. Crystal Growth & Design 2004, 4 (4), 759-764.
Otero-González, L.; Mikhalovsky, S. V; Václavíková, M.; Trenikhin, M. V; Cundy, A. B.; Savina, I. N. Novel Nanostructured Iron Oxide Cryogels for Arsenic (As (III)) Removal. J. Hazard. Mater. 2020, 381, 120996.
Page et al., "Probing Local Dipoles and Ligand Structure in $BaTiO_3$ Nanoparticles", Chem. Mater. 2010, 22, 4386-4391.
Paul, B.; Banerji, P. Optical and Electrical Properties of As-Grown Single Crystalline PbTe. J. Cryst. Growth 2009, 311 (5), 1260-1263.
Quan, Z.; Li, C.; Zhang, X.; Yang, J.; Yang, P.; Zhang, C.; Lin, J., Polyol-Mediated Synthesis of PbS Crystals: Shape Evolution and Growth Mechanism. Crystal Growth & Design 2008, 8 (7), 2384-2392.
Querejeta-Fernández, A.; Hernández-Garrido, J. C.; Yang, H.; Zhou, Y.; Varela, A.; Parras, M.; Calvino-Gámez, J. J.; González-Calbet, J. M.; Green, P. F.; Kotov, N. A., Unknown Aspects of Self-Assembly of PbS Microscale Superstructures. ACS Nano 2012, 6 (5), 3800-3812.
Ramasubbu, V.; Kumar, P. R.; Mothi, E. M.; Karuppasamy, K.; Kim, H.-S.; Maiyalagan, T.; Shajan, X. S. Highly Interconnected Porous TiO2-Ni-MOF Composite Aerogel Photoanodes for High Power Conversion Efficiency in Quasi-Solid Dye-Sensitized Solar Cells. Appl. Surf. Sci. 2019, 496, 143646.
Rammal et al., "1/ f noise in random resistor networks: Fractals and percolating systems", Phys. Rev. A 1985, 31, 2662.
Rechberger et al., "Assembly of $BaTiO_3$ Nanocrystals into Macroscopic Aerogel Monoliths with High Surface Area", Angew. Chem. Int. Ed. 2014, 53, 6823-6826.
Saez Cabezas, C. A.; Sherman, Z. M.; Howard, M. P.; Dominguez, M. N.; Cho, S. H.; Ong, G. K.; Green, A. M.; Truskett, T. M.; Milliron, D. J. Universal Gelation of Metal Oxide Nanocrystals via Depletion Attractions. Nano Lett. 2020, 20 (5), 4007-4013.
Shao et al., "Self-Assembly of Graphene Oxide at Interfaces", Adv. Mater. 2014, 26, 5586.
Sone, E. D.; Zubarev, E. R.; Stupp, S. I., Semiconductor Nanohelices Templated by Supramolecular Ribbons. Angewandte Chemie International Edition 2002, 41 (10), 1705-1709.
Sun et al., "Salt-induced aggregation of gold nanoparticles for photoacoustic imaging and photothermal therapy of cancer", Nanoscale, 2016, 8, 4452.
Tang et al., "Spontaneous Organization of Single CdTe Nanoparticles into Luminescent Nanowires", Science 297, 237 (2002).
Vecchio, D. A.; Mahler, S. H.; Hammig, M. D.; Kotov, N. A. Structural Analysis of Nanoscale Network Materials Using Graph Theory. ACS Nano 2021. https://doi.org/10.1021/acsnano.1c04711.
Wan, J.; Chen, X.; Wang, Z.; Yu, W.; Qian, Y., Synthesis of uniform PbS nanorod bundles via a surfactant-assisted interface reaction route. Materials Chemistry and Physics 2004, 88 (1), 217-220.
Wan, W.; Zhang, R.; Ma, M.; Zhou, Y. Monolithic Aerogel Photocatalysts: A Review. J. Mater. Chem. A 2018, 6 (3), 754-775.
Wang, D.; Yu, D.; Shao, M.; Liu, X.; Yu, W.; Qian, Y., Dendritic growth of PbS crystals with different morphologies. Journal of Crystal Growth 2003, 257 (3), 384-389.
Wang, N.; Cao, X.; Guo, L.; Yang, S.; Wu, Z., Facile Synthesis of PbS Truncated Octahedron Crystals with High Symmetry and Their Large-Scale Assembly into Regular Patterns by a Simple Solution Route. ACS Nano 2008, 2 (2), 184-190.
Wang, Q.; Wang, L.; Detamore, M. S.; Berkland, C. Biodegradable Colloidal Gels as Moldable Tissue Engineering Scaffolds. Adv. Mater. 2008, 20 (2), 236-239.
Wang, S. F.; Gu, F.; Lü, M. K., Sonochemical Synthesis of Hollow PbS Nanospheres. Langmuir 2006, 22 (1), 398-401.
Wang, Y.; Dai, Q.; Yang, X.; Zou, B.; Li, D.; Liu, B.; Hu, M. Z.; Zou, G., A facile approach to PbS nanoflowers and their shape-tunable single crystal hollow nanostructures: Morphology evolution. CrystEngComm 2011, 13 (1), 199-203.
Warner, J. H.; Thomsen, E.; Watt, A. R.; Heckenberg, N. R.; Rubinsztein-Dunlop, H., Time-resolved photoluminescence spectroscopy of ligand-capped PbS nanocrystals. Nanotechnology 2004, 16 (2), 175-179.
Weidman, M. C.; Nguyen, Q.; Smilgies, D.-M.; Tisdale, W. A., Impact of Size Dispersity, Ligand Coverage, and Ligand Length on the Structure of PbS Nanocrystal Superlattices. Chemistry of Materials 2018, 30 (3), 807-816.

(56) References Cited

OTHER PUBLICATIONS

Wen, D.; Liu, W.; Haubold, D.; Zhu, C.; Oschatz, M.; Holzschuh, M.; Wolf, A.; Simon, F.; Kaskel, S.; Eychmüller, A. Gold Aerogels: Three-Dimensional Assembly of Nanoparticles and Their Use as Electrocatalytic Interfaces. ACS Nano 2016, 10 (2), 2559-2567.

Werner, C. J. MCNP Users Manual-Code Version 6.2. Los Alamos Natl. Lab. 2017.

Xia, Y.; Yang, P.; Sun, Y.; Wu, Y.; Mayers, B.; Gates, B.; Yin, Y ; Kim, F.; Yan, H., One-Dimensional Nanostructures: Synthesis, Characterization, and Applications. Advanced Materials 2003, 15 (5), 353-389.

Xu, X.; Kweon, K. E.; Keuleyan, S.; Sawvel, A.; Cho, E. J.; Orme, C., Rapid In Situ Ligand-Exchange Process Used to Prepare 3D PbSe Nanocrystal Superlattice Infrared Photodetectors. 2021, 17 (25), 2101166.

Yu, D.; Wang, D.; Meng, Z.; Lu, J.; Qian, Y., Synthesis of closed PbS nanowires with regular geometric morphologies. Journal of Materials Chemistry 2002, 12 (3), 403-405.

Yu, S.-H.; Yoshimura, M., Shape and Phase Control of ZnS Nanocrystals: Template Fabrication of Wurtzite ZnS Single-Crystal Nanosheets and ZnO Flake-like Dendrites from a Lamellar Molecular Precursor ZnS. (NH2CH2CH2NH2)0.5. Advanced Materials 2002, 14 (4), 296-300.

Yuan et al., "Magnetoreflectivity of Pb☒$_x$Eu x Te epilayers and PbTe/$Pb_1X_1$☒$_x$$Eu_x$ Te multiple quantum wells", Physical Review B, vol. 55, No. 7, 4607, Feb. 15, 1997.

Zhang, Q.; Bahadur, D.; Dufresne, E. M.; Grybos, P.; Kmon, P.; Leheny, R. L.; Maj, P.; Narayanan, S.; Szczygiel, R.; Ramakrishnan, S. Dynamic Scaling of Colloidal Gel Formation at Intermediate Concentrations. Phys. Rev. Lett. 2017, 119 (17), 178006.

Zhao, Z.; Zhang, K.; Zhang, J.; Yang, K.; He, C.; Dong, F.; Yang, B., Synthesis of size and shape controlled PbS nanocrystals and their self-assembly. Colloids and Surfaces A: Physicochemical and Engineering Aspects 2010, 355 (1), 114-120.

Ziegler, C.; Wolf, A.; Liu, W.; Herrmann, A.; Gaponik, N.; Eychmüller, A. Modern Inorganic Aerogels. Angew. Chemie Int. Ed. 2017, 56 (43), 13200-13221.

Zámbó, D.; Schlosser, A.; Rusch, P.; Lübkemann, F.; Koch, J.; Pfnür, H.; Bigall, N. C. A Versatile Route to Assemble Semiconductor Nanoparticles into Functional Aerogels by Means of Trivalent Cations. Small 2020, 16 (16), 1906934.

* cited by examiner

LEAD CHALCOGENIDE NANOCRYSTALLINE SEMICONDUCTOR SYNTHESIS AND RADIATION DETECTION

CROSS-REFERENCE TO RELATED APPLICATION

This application claims the benefit of U.S. provisional application entitled "Lead Chalcogenide Nanocrystalline Semiconductor Synthesis and Radiation Detection," filed Jul. 5, 2022, and assigned Ser. No. 63/358,420, the entire disclosure of which is hereby expressly incorporated by reference.

STATEMENT REGARDING FEDERALLY SPONSORED RESEARCH OR DEVELOPMENT

This invention was made with government support under Contracts Nos. 2015-DN-077-ARI097 and 15DNARI00015-05-00 awarded by the Department of Homeland Security, and under Contracts Nos. HDTRA1-13-C-0050, D18AP00063, and HDTRA12020002 awarded by the Department of Defense. The government has certain rights in the invention.

BACKGROUND OF THE DISCLOSURE

Field of the Disclosure

The disclosure relates generally to lead chalcogenide-based nanocrystalline semiconductors.

Brief Description of Related Technology

Lead chalcogenide nanocrystal (NC)-based optoelectronic devices derived from solution-based synthesis procedures offer the promise of facile manufacturing, simple device architectures, and enhanced control over the solid's thermal and optical properties via size and shape control of the nanocrystalline constituents. Known for its strong quantum confinement effects over a wide range of sizes due to its relatively large exciton Bohr radius (46 nm), lead selenide (PbSe) has been heavily studied. For instance, the promise of high carrier multiplication efficiency in PbSe has inspired the use of PbSe-based optoelectronic devices ranging from photodiodes to photovoltaic cells.

If one can discourage thermal loss processes and preferentially de-excite above-bandgap carriers via carrier multiplication, which is typically termed multi-exciton generation (MEG) when quantum-confined materials are employed, then the conversion efficiencies of optoelectronic devices can be enhanced. A phonon bottleneck effect was predicted and observed to be particularly prominent in semiconductor quantum dots (i.e., semiconductor nanocrystals confined in three-dimensions). Time-resolved spectroscopic observations of PbSe and PbTe carrier relaxation dynamics showed that carrier populations beyond the discretized energy states and into the condensed density-of-states energy manifold contained regions of transient stability, where the electron-phonon energy exchange rate could be restricted so that cooling rate of hot carriers could be diminished. The degree to which MEG can play a prominent role in a sensor's operation depends on the energy of the impinging quantum relative to the material's band-gap energy ($E_g$) as well as the charge-transport characteristics after their creation.

For solar optical photons, the power conversion efficiencies of photovoltaic devices can potentially be enhanced by exploiting MEG in nanostructured media without having to resort to multiple junction designs. Unfortunately, the relatively high energy-threshold beyond which MEG is present ($h\nu > 2.9\ E_g$ for PbTe, $h\nu > 3.4\ E_g$ for PbSe) as well as the gradual increase in the MEG efficiency beyond that threshold have prevented photovoltaic device efficiencies from achieving technologically impactful values, as of yet, despite substantial efforts to exploit the phenomenon. However, if the impinging quanta possesses an energy that is well above the band-gap, such as in the case of x-rays or nuclear radiation (gamma-rays, alpha particles, neutrons), then the delta ray that results from such an interaction can possess a large carrier population with energies that can be orders of magnitude greater than the bandgap energy.

One might, therefore, be able to exploit MEG to produce high-energy sensors within which a greater portion of the initial particle energy is converted into those information carriers (photons in scintillators and electron-hole pairs in semiconductors) that can contribute to the signal formation. Indirect scintillating radiation detectors—in which the impinging quanta is first converted into optical photons that are subsequently transformed into the measured current—can efficiently detect gamma-rays and neutrons but at the typical cost of poorer energy-resolution relative to direct detectors. Solution-processed nanostructured materials can be of particular utility when characterizing broadly distributed sources, such as those imaging instruments coupled to neutron or x-ray sources. For instance, a colloid composed of nanosheets of cesium lead bromide ($CsPbBr_3$) was shown to have a good light yield (~21,000 ph/MeV) and facile process compatibility with x-ray imaging configurations. Other inorganic halide perovskites and organic-inorganic halide perovskite nanocrystallites have been demonstrated as effective conversion media for fast neutron imaging. However, for pulse-mode radiation spectroscopy, in which the energy of each impinging quanta is measured, scintillators in general and nanostructured scintillation media in particular typically deliver an energy resolution that is at least an order of magnitude worse than state-of-the-art semiconductor detectors. Ideally, one would couple the low-cost and large-area form-factors typical of solution-processed scintillators with the high-resolution performance delivered by semiconductor-sensors derived from silicon, cadmium telluride (CdTe), cadmium zinc telluride (CZT), or high-purity germanium (HPGe).

Energy resolutions comparable to that produced by high-purity germanium detectors cooled to cryogenic temperatures have been shown in drop-cast PbSe solids bounded by gold electrodes. However, extending the depth of the drop- or spun-cast self-assembled solids to the millimeter and centimeter scales relevant to high-efficiency x-ray and gamma-ray detection can be challenging because of crack formation that may accompany the drying of solids.

A sizable detecting volume is of little use if barriers preventing effective change transport are distributed throughout the colloidal solid. For example, oxidation on the PbSe nanocrystal surface can act as a barrier over which carriers must surmount or tunnel through in order to facilitate charge transport and collection. In fact, oxidation upon air exposure can result in chemical instability for PbSe nanocrystals, thereby hindering the development of PbSe nanocrystal-based optoelectronic devices.

As an example, PbSe nanocrystals fabricated with trioctylphosphine selenide (TOPSe) experience degradation when exposed to oxygen. Specifically, the selenium (Se) within the chalcogenide surface is readily oxidized when interacting with oxygen, thereby creating charge trap states.

This can cause PbSe nanocrystals to experience oxidation quite rapidly and uncontrollably based on particular conditions pertaining to the synthesis.

Reports characterizing the surface atoms of PbSe nanocrystals that undergo oxidation (PbO, $SeO_2$, $PbSeO_3$) have helped put strategies in place for alleviating these instabilities. Passivating the surface of PbSe nanocrystals with an inorganic shell is an option. For instance, a CdSe shell has been grown on PbSe nanocrystals (via cation exchange) that was significantly more stable against oxidation. However, the CdSe shell tends to serve as a barrier for charge transfer between nanocrystals. This makes the use of PbSe/CdSe core/shell nanocrystals in devices limited. Another approach that improved the optical properties and enhanced stability toward oxidation of PbSe nanocrystals was based on the $Cl_2$-facilitiated removal of surface Se atoms, forming a passivation sub-monolayer of $PbCl_x$ which could effectively prevent oxidation during long-term air exposure at the possible expense of PbSe nanocrystal uniformity.

SUMMARY OF THE DISCLOSURE

In accordance with one aspect of the disclosure, a device for radiation detection includes a first electrode, a second electrode spaced apart from the first electrode, and a macroscale structure disposed between the first electrode and the second electrode. The macroscale structure includes a composite arrangement of nanocrystalline particles. The nanocrystalline particles include a lead chalcogenide material. The nanocrystalline particles establish conductive paths between the first electrode and the second electrode without an intervening conductive polymer agent.

In accordance with another aspect of the disclosure, a device for radiation detection includes a first electrode, a second electrode spaced apart from the first electrode, and a macroscale structure disposed between the first electrode and the second electrode. The macroscale structure includes a colloidal arrangement of nanoparticles. The nanoparticles include a lead chalcogenide material. The colloidal arrangement establishes oxide-free conductive paths between the first electrode and the second electrode.

In accordance with yet another aspect of the disclosure, a method of fabricating a PbSe-based macroscale colloidal structure includes forming a lead-oleate precursor, forming a selenium precursor by dissolving selenium in tris(diethylamino)phosphine (TDP), synthesizing a colloidal solution of nanocrystalline particles by injecting the selenium precursor into a solution including the lead-oleate precursor, isolating a solid mass of the nanocrystalline particles from the colloidal solution, and forming the macroscale colloidal structure from a mixture of the solid mass and an organic solvent via evaporation of the organic solvent.

In connection with any one of the aforementioned aspects, the devices and/or methods described herein may alternatively or additionally include or involve any combination of one or more of the following aspects or features. surfaces of the nanocrystalline particles are passivated by phosphorous-oxygen (P—O) moieties. The lead chalcogenide material is PbSe. The composite arrangement includes structure directing ligands. The structure directing ligands include tris (diethylamino)phosphine (TDP) or a derivative thereof. Adjacent nanocrystalline particles in the composite arrangement exhibit nanoparticle necking. The conductive paths include nanocrystal-to-nanocrystal atomic bonding. The lead chalcogenide material is PbTe. The lead chalcogenide material is PbS. The colloidal arrangement includes structure directing ligands. Adjacent nanocrystalline particles in the colloidal arrangement exhibit nanoparticle necking. The oxide-free conductive paths include nanocrystal-to-nanocrystal atomic bonding. Synthesizing the colloidal solution includes heating the solution before injecting the selenium precursor. Forming the lead-oleate precursor includes dissolving lead oxide in trifluoroacetate anhydride solution to produce a lead trifluoroacetate product, and neutralizing the lead trifluoroacetate product with oleic acid and triethylamine. Forming the lead-oleate precursor includes refining a lead-oleate participate.

BRIEF DESCRIPTION OF THE DRAWING FIGURES

For a more complete understanding of the disclosure, reference should be made to the following detailed description and accompanying drawing figures, in which like reference numerals identify like elements in the figures.

FIG. 1 depicts a comparison of TOP- and TDP-based PbSe nanocrystals via graphical plots of absorbance spectra of (a) TDP-PbSe nanocrystals and (b) TOP-PbSe nanocrystals dispersed in tetrachloroethylene (TCE), in which the absorbance spectra were recorded with the nanocrystals as prepared and then following air-exposure for days (shown in legend) following the synthesis, as well as transmission electron microscopy (TEM) images of (c) spherical PbSe nanocrystals with 1 M TDPSe possessing a diameter of 5.3±0.4 nm and (d) rhombicuboctahedron PbSe nanocrystals with 1 M TOPSe having a diameter of 5.5±0.6 nm. Scale bars are 50 nm, with insets showing HRTEM images of a TDP-PbSe nanocrystal outlined in part c, and a TOP-PbSe nanocrystal outlined in part d. Both nanocrystals possess a lattice spacing of 3.1 Å, which corresponds to the expected PbSe (200) plane separation.

FIG. 2 depicts a structural and surface property comparison of TOP-PbSe and TDP-PbSe nanocrystals via graphical plots of (a) XRD patterns of TDP- and TOP-PbSe nanocrystals, (b) $^{31}P\{^{1}H\}$ NMR spectra of TOP-PbSe nanocrystals and TDP-PbSe nanocrystals dispersed in benzene-$d_6$, and (c) FTIR spectra of TDP- and TOP-PbSe nanocrystals along the stretching vibrational region of P—O at the range of 850-1150 $cm^{-1}$ (shaded portion).

FIG. 3 is a schematic view of the synthesis of TDP-PbSe nanocrystals in accordance with one example, including depiction of (a) the synthesis of lead oleate (from lead oxide), (b) the synthesis of PbSe nanocrystals from lead oleate and TDP, in which $Et_3N$, triethylamine; $R_a$=$C_{17}H_{33}$; $R_b$=$C_4H_{10}$; Pb(oleate)=Pb($R_a$COO)$_2$, and (c) fabricated PbSe nanocrystals initially possessing OA and TDP along a surface of the nanocrystal as well as within the colloid. During heating of the PbSe synthesis and the clean-up procedure, components of TDP may assist in the formation of P—O bonds and/or some derivative of TDP, as shown.

FIG. 4 depicts graphical plots showing valence state variation of TOP-PbSe and TDP-PbSe nanocrystal surface atoms in connection with Pb 4f (left) and Se 3d (right) XPS spectra collected from (a, b) TDP-PbSe nanocrystals along with (c, d) relatively fresh and (e, f) old TOP-PbSe nanocrystals. The shift in binding energy from Pb 4f XPS spectra displays passivation of Pb by P—O moieties in the 117-day old TDP-PbSe case when contrasted with spectra from 5- and 55 day-old TOP-PbSe nanocrystals. In Se 3d XPS spectra, there is no shift in binding energy, however, increased Se oxidation is observed in the TOP-PbSe samples as they age.

FIG. 5 depicts high-resolution TEM (HRTEM) micrographs of solution of TDP-PbSe nanocrystals in TCE exhibiting oriented attachment, specifically (a) an example of square ordering within the TDP-PbSe sample and the formation of nanocrystals into an atomically interconnected chain, (b) the formation of colloidal TDP-PbSe solids in TCE solution, (c) a colloidal solid after solvent evaporation, and (d) a graphical plot of small-angle x-ray scattering, as a function of the 2θ scattering angle, from a solution-grown solid of PbSe nanocrystals after full drying of the solid, showing the measured data and the modeled distribution.

FIG. 6 depicts (a) a schematic view of an experimental setup for a radiation detection device having a TDP-PbSe nanocrystalline solid structure in accordance with one example, in which the induced current pulse from the detector device is integrated and amplified by a charge-sensitive amplifier (CSA), and the output is band-pass filtered through a pulse-shape amplifier (PSA) to improve the signal-to-noise ratio and eliminate the long-integrated tail of the CSA pulse, and a multi-channel analyzer linearly bins the pulse heights across 0-10 V, along with graphical plots of photon spectra, including (b) a spectral comparison between commercial (1 mm thick from Acrorad) CdTe single-crystalline (SC) detector, a commercial HPGe detector, and a nanostructured PbSe colloidal solid, when exposed to x-rays and gamma-rays emitted from $^{133}$Ba (the PbSe nanocrystal solid is biased to 300 V in this example, with a leakage current of 1.0 nA), (c) an expanded view of part (b) with MCNP simulation results included, HPGe-derived peak shown, and Gaussian-fit to the full-energy peak, and (d) a spectral comparison between CdTe single-crystalline (SC) detector, HPGe detector and nanostructured PbSe colloidal solid, when exposed to x-rays and gamma-rays emitted from $^{133}$Ba.

FIG. 7 depicts the structural characterization of gels formed from citrate-stabilized PbTe nanoparticles, including (a-d) HR-TEM images displaying the morphology of the network structure and the arrangement of the nanoparticle subunits to form fibers, showing (a-c) a mesoscale architecture of nanofiber networks of PbTe nanoparticles and (d) an arrangement of individual nanoparticles in a branching nanofiber, (e) a photograph of a transparent PbTe hydrogel in a vial, turned onto its side, and (f) an SEM image of a PbTe aerogel prepared by lyophilization of a frozen hydrogel.

Figure 11:
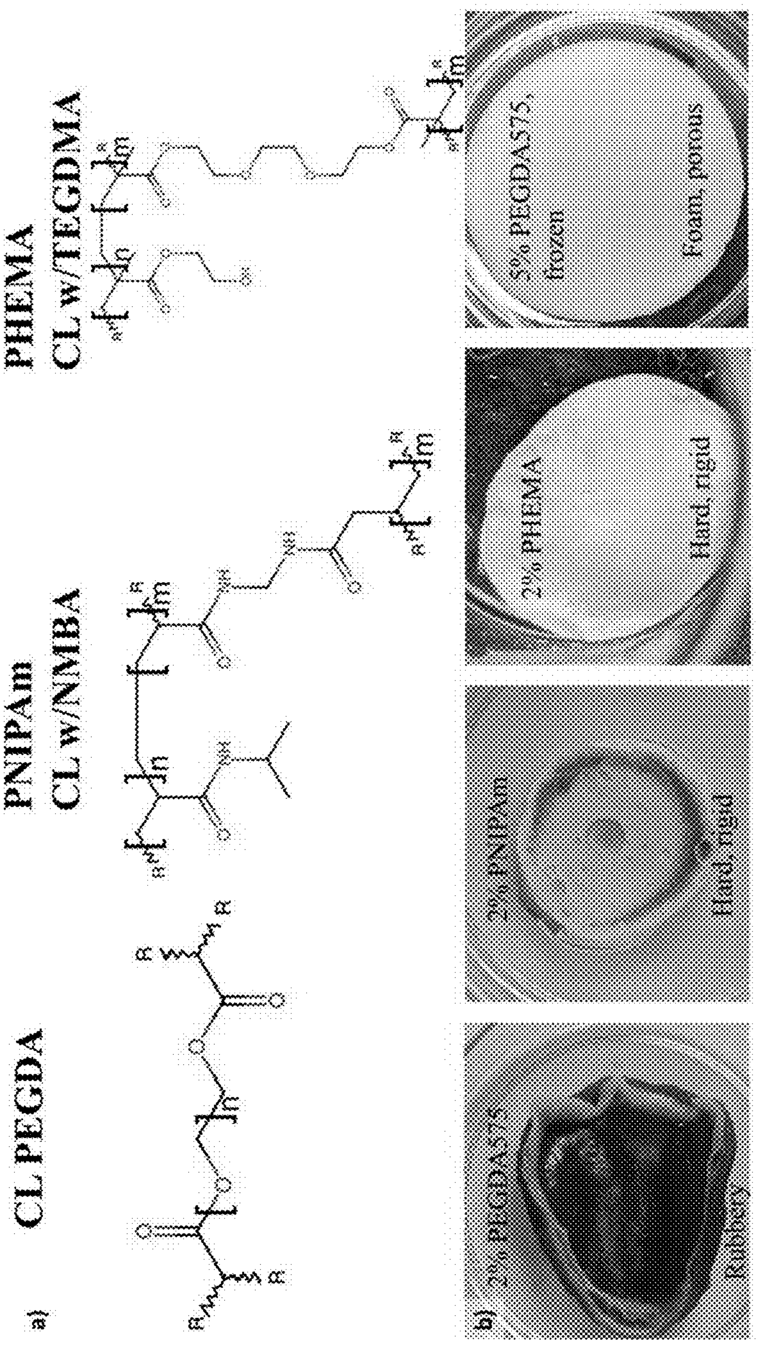

FIG. 11 depicts polymer systems used to form composites with PbTe nanoparticle gels in accordance with three examples: crosslinked poly(ethylene glycol) diacrylate, poly (N-isopropylacrylamide) crosslinked with N,N-methylenebis(acrylamide), poly(2-hydroxyethyl methacrylate) crosslinked with triethylene glycol dimethacrylate, along with photographs of the PbTe nanocomposites including the different polymers.

Figure 12:
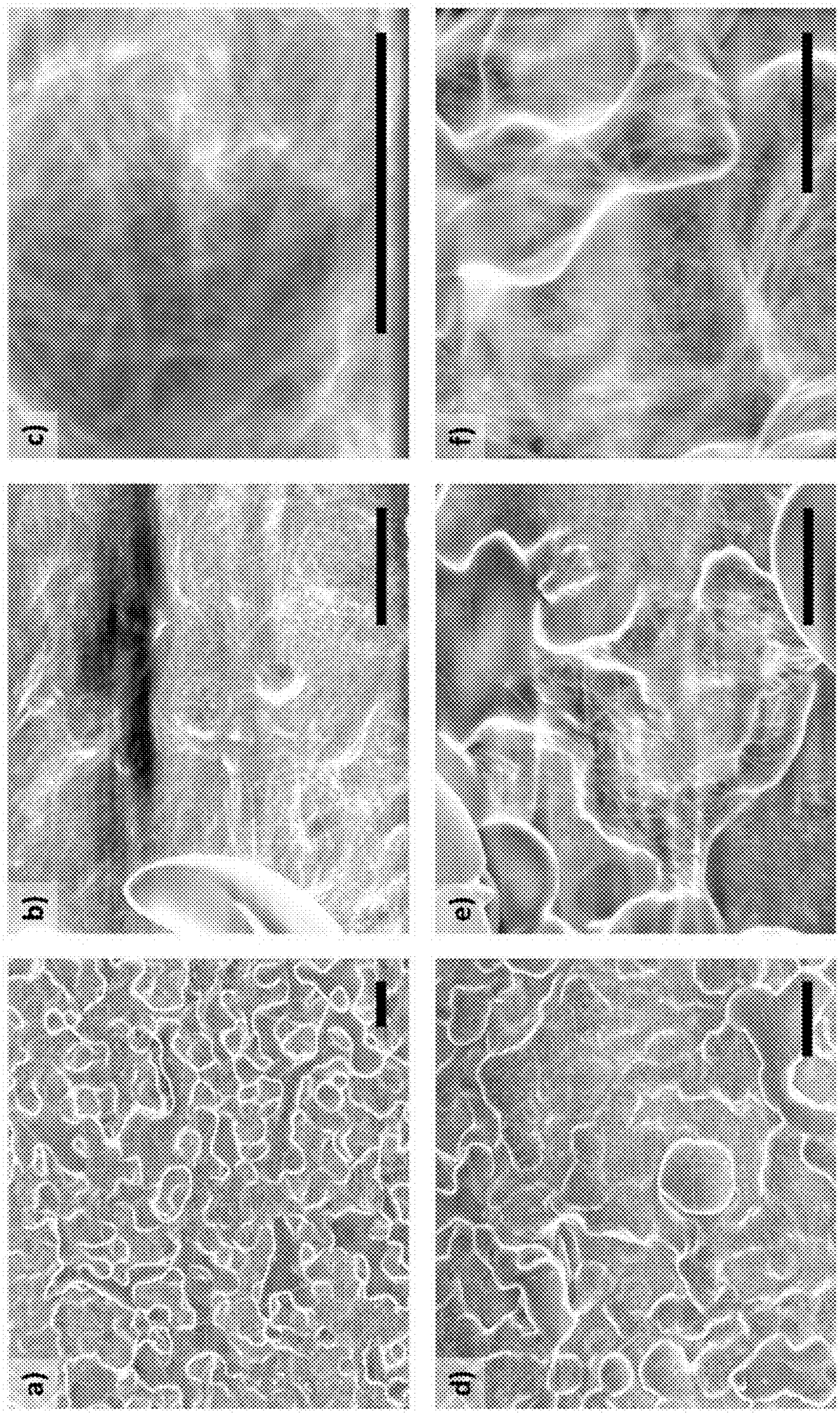

FIG. 12 depicts high-resolution SEM images of an example composite prepared from Cit-PbTe and 1% crosslinking PHEMA polymer (scale bars all represent 1 μm).

Figure 13:
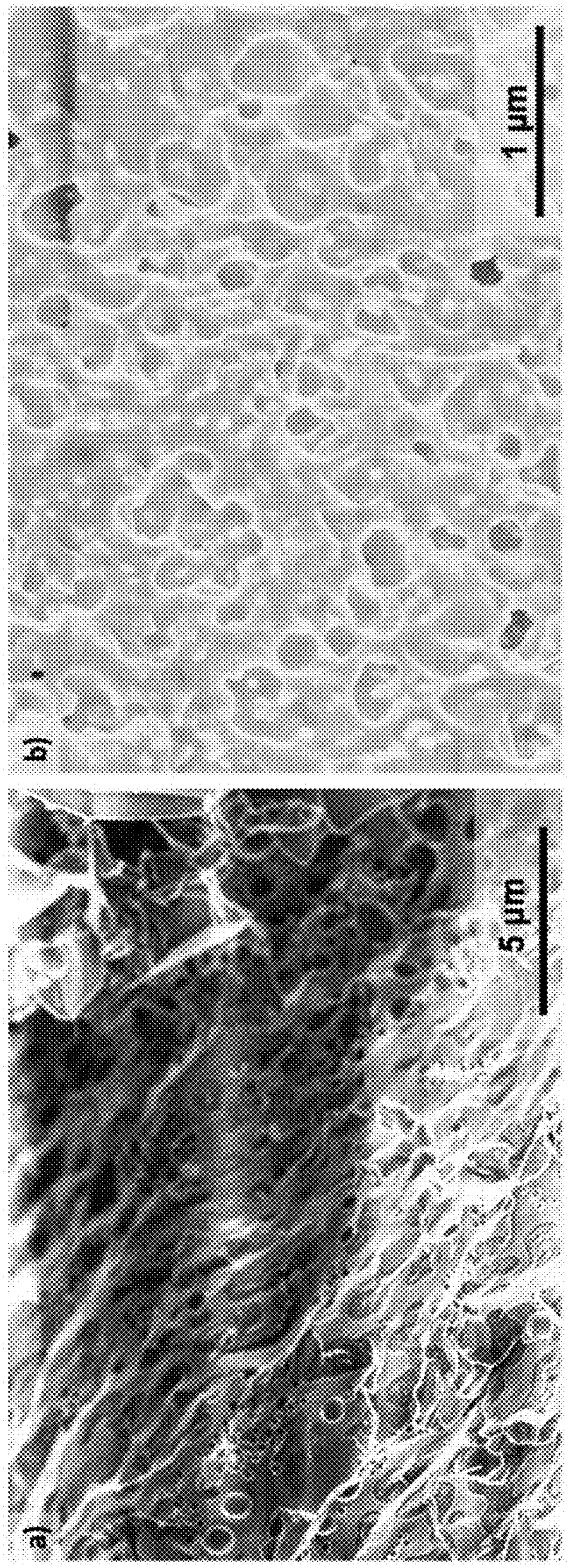

FIG. 13 depicts SEM images of an example of a PbTe+0.5% PHEMA composite after annealing for 1 hour at 200° C.

Figure 14:
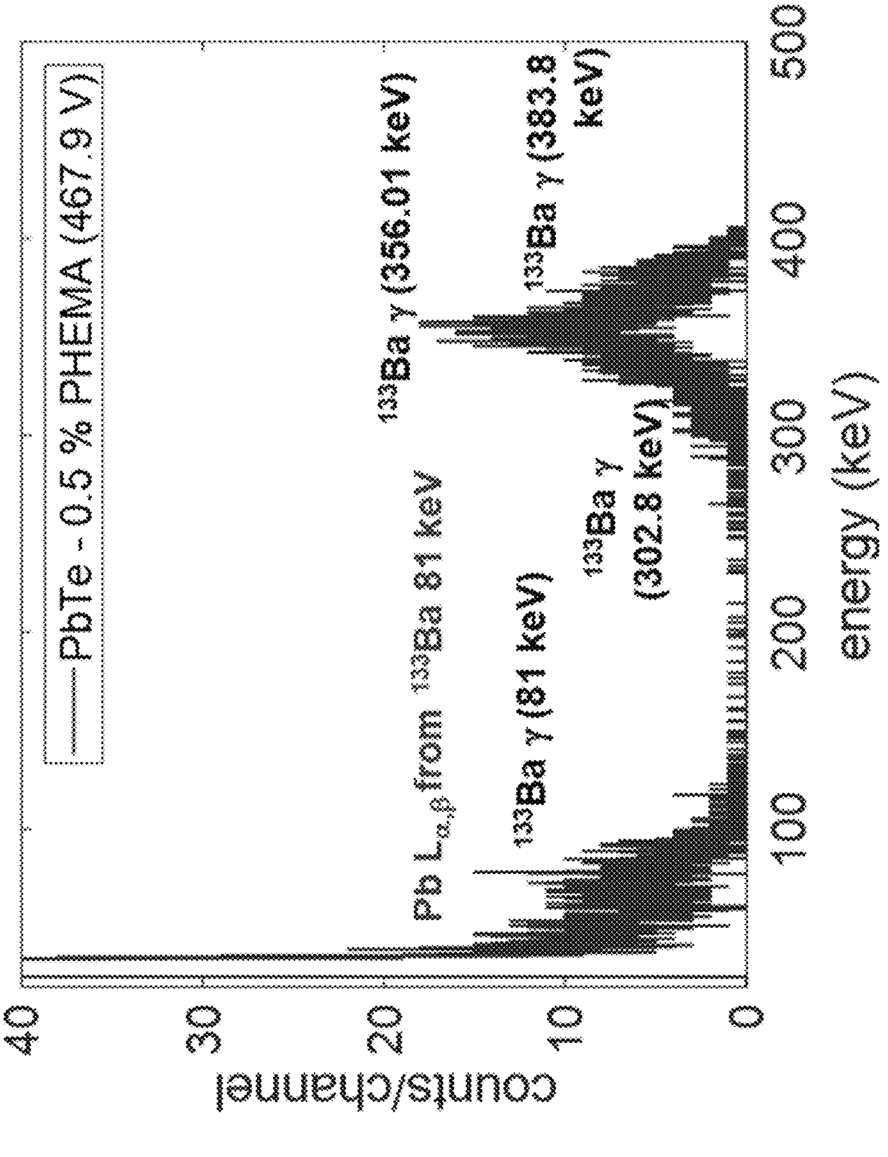

FIG. 14 is a graphical plot of a gamma-ray spectrum derived from Ba-133 source impinging photons upon the composite of FIG. 13.

The embodiments of the disclosed devices and methods may assume various forms. Specific embodiments are illustrated in the drawing and hereafter described with the understanding that the disclosure is intended to be illustrative. The disclosure is not intended to limit the invention to the specific embodiments described and illustrated herein.

DETAILED DESCRIPTION OF THE DISCLOSURE

Devices for radiation detection are described. The devices include a lead chalcogenide-based macroscale structure having a composite (or colloidal) arrangement of nanocrystalline particles (or nanoparticles). The nanocrystalline particles establish conductive paths without an intervening conductive polymer agent. The conductive paths may be oxide free. Methods for synthesizing the composite arrangement and fabricating such devices are also described. For instance, in PbSe cases, macroscopic colloidal crystals are fully grown in a stability-enhanced PbSe solution.

The disclosed devices and methods may utilize a polymeric template to which nanocrystals are bonded. The active volume of the sensor device may thus be extended.

The disclosed devices also address the charge carrier transport-related challenges presented by macroscale sensing volumes. In some cases (e.g., PbSe cases), charge carrier transport is facilitated via the prevention of oxidation on the nanocrystal surface (e.g., the PbSe nanocrystal surface), which can otherwise act as a barrier to charge carrier transport. The disclosed methods are thus configured for preparation of air-stable nanocrystalline solids (e.g., PbSe nanocrystals), thereby supporting effective integration of the nanocrystals into a variety of devices.

The synthesis of the nanocrystals may be achieved via solution-process methods. For instance, in PbSe cases, tris (diethylamino)phosphine (TDP) may be used as a Se precursor that generates chemical stability for the PbSe nanocrystals via improved surface passivation. TDPSe, which is produced by the reaction of TDP with elemental Se, is used as a selenium precursor instead of TOPSe. The alteration of the ligand structure drastically enhanced the air stability of PbSe QDs through the formation of P—O moieties on QDs surface that passivated the reactive PbSe surface Further details regarding the long term stability of the TDP-PbSe nanocrystals in a composite, colloidal arrangement of a detector device are now described in connection with FIGS. 1-6.

The effective electronic coupling of the nanocrystals throughout the solid is useful to facilitate lossless charge transport and collection, a property used to make a faithful measurement of the energy deposited by the incident quanta. The transformation of the nanoparticle solution into a sensing colloidal solid therefore avoids loss mechanisms at the interfaces. One mechanism through which thermal losses and trapping can be enhanced is through the growth of Pb and Se oxides at the PbSe nanocrystal surface. Rather than passivate the nanocrystal surface via core-shell nanocrystals or via lead-halides (which can modify the band-structure and minority carrier population and thereby affect the overall device design), the nanocrystal surface may be passivated via phosphorous-oxygen (P—O) moieties, which may be derived from TDPSe as the Se precursor. In one example, at least 1.6 years of stability against oxidation was successfully realized, as described below.

The disclosed methods may be or include a solution-based process to synthesize a colloidal solution of monodisperse PbSe nanocrystals. In some cases, highly air-stable PbSe nanocrystals are produced by: (1) introducing the TDP as a Se source within the Se precursor, in the form of TDPSe (denoted as TDP-PbSe nanocrystals) instead of TOPSe (denoted as TOP-PbSe nanocrystals), and (2) fabricating lead oleate of high purity, achieved by adjusting the conditions of the Pb precursor. In order to facilitate high reactivity, pure hydroxide-free lead oleate may be prepared by dissolving lead oxide in trifluoroacetate anhydride solution followed by the neutralization of the lead trifluoroacetate product with oleic acid and triethylamine.

In TDP-PbSe synthesis examples, a Pb precursor may be prepared as described in Hendricks et al., "A tunable library of substituted thiourea precursors to metal sulfide nanocrystals," Science 2015, 348 (6240), 1226-1230, the entire disclosure of which is hereby incorporated by reference.

Despite the shape and size control that can be derived from the synthesis of TOP-PbSe nanocrystals, the nanocrystals may be unstable in ambient conditions due to their high susceptibility to oxidation, resulting in undesired alterations in the properties of the nanocrystals. The surface atoms of the PbSe nanocrystals may form oxides, such as PbO, $PbSeO_3$, $SeO_2$.

Figure 1:
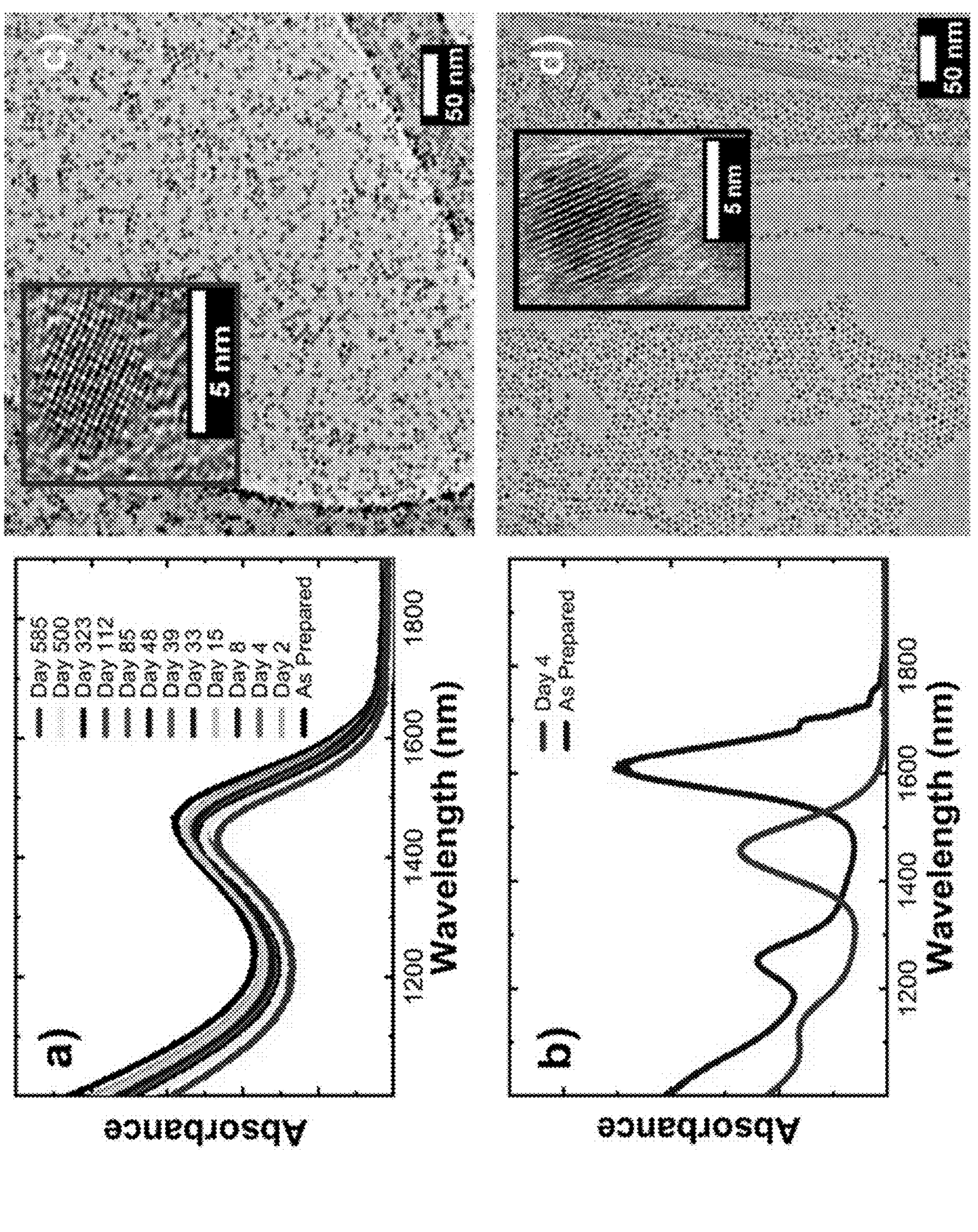

In order to investigate the stability of the TDP-PbSe nanocrystals, the nanocrystals were stored under ambient conditions, and their optical absorbance spectra was recorded over time. As shown in FIG. 1, part b, the optical response of the TOP-PbSe nanocrystals blue shifts and diminishes in luminescent intensity rapidly (on the order of a few days), an oxidation and destabilization of the nanocrystal electro-optical properties that continues beyond the four days shown. In contrast, the shape and peak position of the absorbance distribution for the TDP-PbSe nanocrystals remain stale for at least 585 days of air exposure (see FIG. 1, part a).

The optical characterization measurements thus indicate that the TDP-PbSe nanocrystals are air-stable for years. To isolate the physical cause of the stability, the microstructure of the nanocrystals was characterized as follows. When TDP interacts with the surface of PbSe nanocrystals, the ligand-nanocrystal interaction causes both the rearrangement of surface atoms as well as an effective passivation of the surface dangling bonds by TDP or its derivatives.

Transmission electron microscopy (TEM) images of monodisperse TDP-PbSe nanocrystals were compared to those of TOP-PbSe nanocrystals in FIG. 1, parts c and d, at both low and high magnifications. Note that although the PbSe nanocrystal assemblies on the TEM grids were formed by drop-casting, the colloidal solids used to form the photosensing structures were interconnected slowly in solution at lower nanocrystal concentrations. The TEM micrographs indicate the nanocrystals coordinated with TDP have a greater shape uniformity than those derived from TOPSe (see FIG. 1, parts c and d). Furthermore, the PbSe nanocrystals derived from TDPSe were more spherical, while the TOPSe-based PbSe nanocrystals tended to have a rhombicuboctahedron shape.

High-resolution (HR)TEM images of the TOP- and TDP-PbSe nanocrystals are shown in the insets of FIG. 1, parts c and d, respectively. Fast Fourier Transform (FFT) analysis of the fringes reveals a rock salt PbSe crystal structure with a 3.0 Å lattice space, which corresponds to the {200} lattice vector matching that of crystalline bulk PbSe. Thus, with the equivalent PbSe (200) lattice spacing and comparable quasi-spherical shape observed for both TOP- and TDP-PbSe nanocrystals, XRD and TEM analyses indicate that TOP- and TDP-PbSe nanocrystals have nearly indistinguishable structures and therefore do not result in disparate structure-induced enhanced stability of the TDP-PbSe nanocrystals.

In quantifying the effects of TDP-PbSe bonding, crystallographic analyses of TOP- and TDP-PbSe nanocrystals were conducted. X-ray diffraction (XRD) patterns of TOP- and TDP-PbSe nanocrystals, such as those shown in FIG. 2, part a, demonstrate that the expected rock salt PbSe structure is preserved regardless of the ligand, although the nanocrystal shape may be slightly modified as revealed in the integrated peak ratios ((111)/(200): 0.34 and 0.29 for TOP- and TDP-PbSe nanocrystals, respectively).

Figure 2:
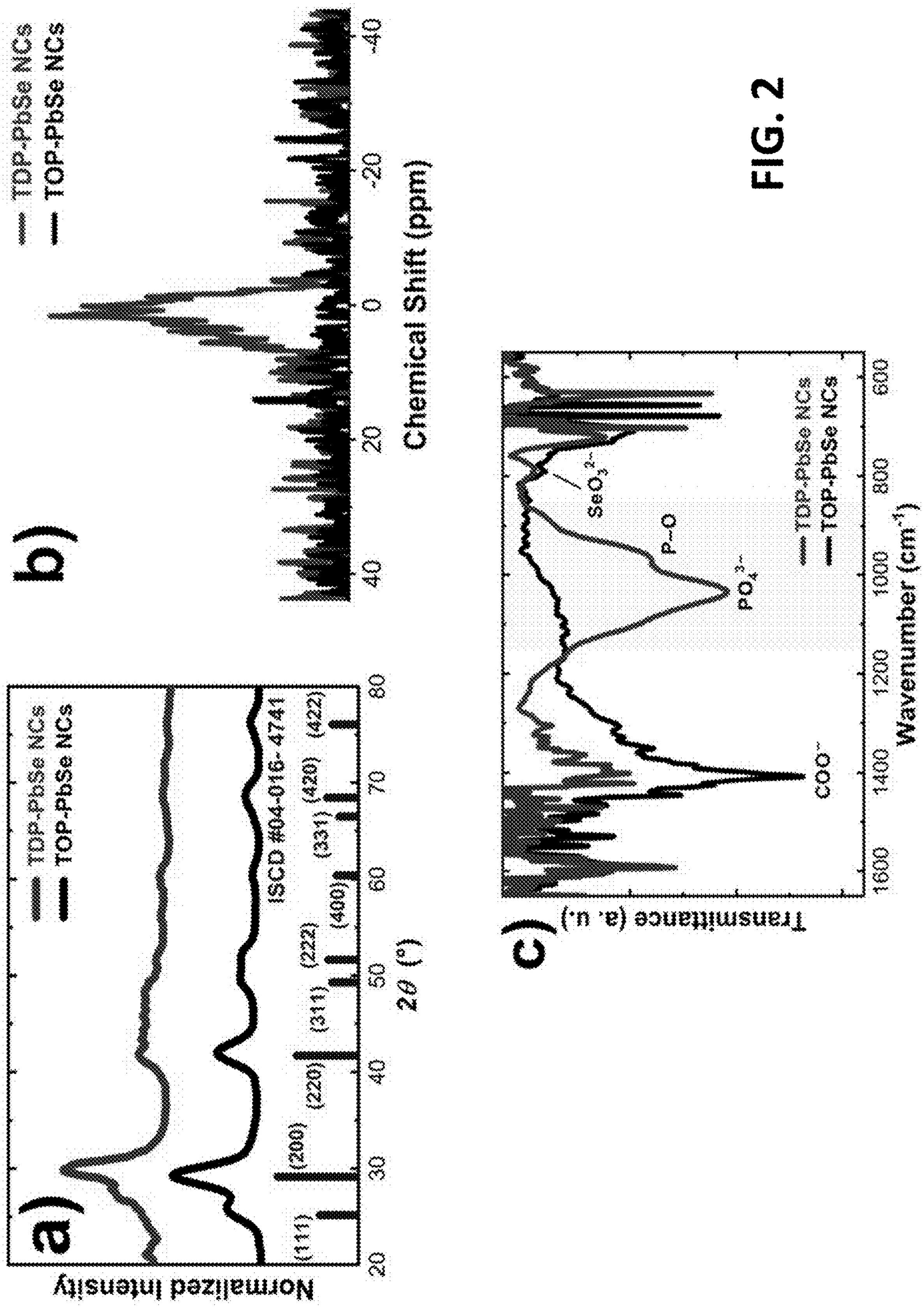
Figure 3:
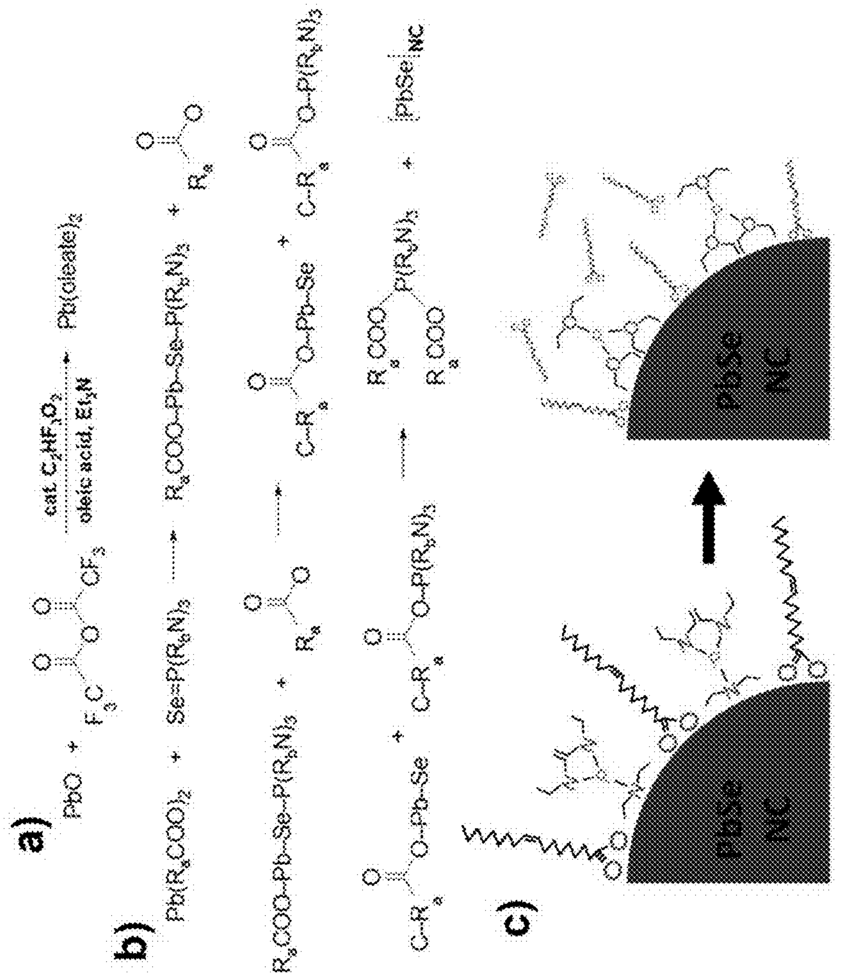
Figure 4:
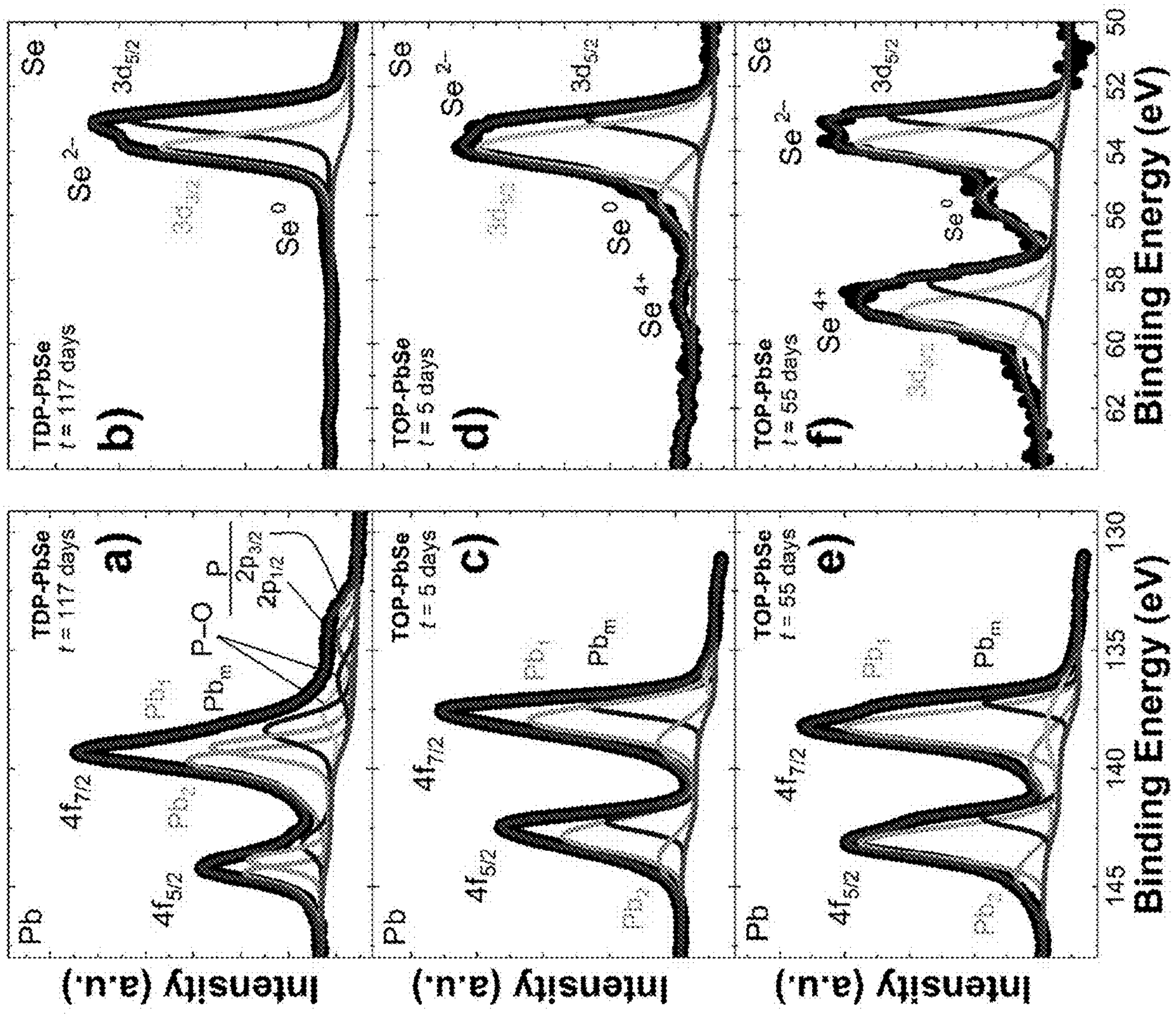

In order to elucidate the surface bonding differences between the two ligand approaches, FIG. 2, part b, displays $^{31}P\{^1H\}$ NMR spectra of TOP- and TDP-PbSe nanocrystals. The presence of a surface bound phosphorus species is demonstrated by the large resonance in the TDP-PbSe spectrum at about 2 ppm (see FIG. 2, part b) in contrast to the absence of the peak in the TOP-PbSe nanocrystal distribution. The existence of phosphorus is additionally apparent and verified by FTIR spectra shown in FIG. 2, part c, in which the P—O— stretching bond lies between 850-1150 $cm^{-1}$. Previous cleavage studies on phosphonic acid (PA) capped CdSe nanocrystals using bis(trimethylsilyl)sulfide ($(TMS)_2S$) or bis(trimethylsilyl)selenide ($(TMS)_2Se$), suggest the surface of the TDP-PbSe nanocrystals possess P—O moieties, such as those shown schematically in FIG. 3. In those studies, TDP derivatives were bound to the nanocrystal surface and cleaved by adding $(TMS)_2S$ (or $(TMS)_2Se$). When in the presence of TMS-chalcogenide, only TDP derivatives on the nanocrystal surface possessing P—O moieties tend to move to bind with TMS because it is thermodynamically preferred.

In this case, though diethylamine is already included in the TDPSe precursor, an excess amount may introduce a ligand exchange within the colloid. The diethylamine can adsorb onto the PbSe nanocrystals via strong coordination bonds with surface metal atoms—a driving force for ligand exchange. The involvement of diethylamine in the Se precursor is capable of removing the natural capping ligand, that being OA, and in doing so, provide the PbSe nanocrystals with a diethylamine monolayer. Keeping in mind diethylamine is also a small molecule, this monolayer can then be removed and/or released from the nanocrystal surface and colloid during the heating process of this metal chalcogenide synthesis when reaching temperatures greater than or equal to about 150° C. Following the thermal conditioning, a derivative of TDP, or phosphorus-containing elements of TDP, are left behind along the nanocrystal surface with either a combination of OA residue or minor surface oxidation, together forming P—O moieties and/or some form thereof along the PbSe nanocrystal surface. As a result, the NMR and FTIR analyses indicate that during the synthesis of TDP-PbSe nanocrystals, TDP transforms into its derivatives forming P—O moieties, which passivate the surface of the PbSe nanocrystals.

The optically-revealed long-term air stability of TDP-PbSe nanocrystals and the FTIR and NMR surface bonding measurements corroborate the hypothesis that the surface bound P—O moieties account for the enhanced stability of the PbSe nanocrystals by preventing the environment-induced alteration of the PbSe nanocrystal surface. In order to detail the nature of surface passivation, x-ray photoelectron spectroscopy (XPS) studies were conducted. For Pb, two peaked features at about 137.9 and about 142.9 eV derived from the Pb $4f_{7/2}$ and Pb $4f_{5/2}$ spin-orbit coupled doublet dominate the XPS spectra in the range of 135 to 147 eV (see FIG. 4, parts a, c, e). Three contributions lie within each peak, which were fitted and analyzed. First, elemental Pb ($Pb^0$; $Pb_m$) at about 131 and about 135.7 eV correlated to Pb—Se bond within PbSe is present. Second, the prominent natural oxide ($Pb^{2+}$; $Pb_1$) at about 136.8 and about 141.8 eV attributed contributions from Pb oleate, $Pb(CROO)_2$; lead oxide, PbO; lead hydroxide, $Pb(OH)_2$; or their combination due to the higher binding energy of Pb—O versus Pb—Se. Finally, oxidized and carbonated Pb ($Pb^{2+}$; $Pb_2$) are evident at about 137.8 and about 142.8 eV representing lead carbonate, $PbCO_3$. The Pb spin-orbit splitting separation values of Pb $4f_{7/2}$-$_{5/2}$ are about 4.89 eV for all PbSe samples, which is consistent with the standard spin-splitting value of 4.9 eV (Pb $4f_{7/2-5/2}$).

The 117-day old TDP-PbSe sample (FIG. 4, part a) exhibits a relatively higher contribution from the $Pb^0$ valence state compared with the elevated $Pb^{2+}$ features from the TOP-PbSe samples (see FIG. 4, parts c, e) which are far less aged, at 5- and 55-days-old respectively, showing the lack of oxidation in the TDP-PbSe nanocrystals compared with the TOP-PbSe nanocrystals.

For the Se XPS scans in the 50-63 eV range (see FIG. 4, parts b, d, f), $3d_{5/2}$ and $3d_{3/2}$ spin-orbit split peaks indicate the presence of $Se^{2-}$, $Se^0$ and $Se^{4+}$ (about 53.8, about 55.4, about 58.5 eV). Specifically, the 117-day old air-exposed TDP-PbSe sample only possesses a single peak at about 53.58 eV attributed to the most reduced state of Se existing as selenide ($Se^{2-}$). The deconvolution of this state (see FIG. 4, part b) showed two contributions from Se $3d_{5/2}$ and Se $3d_{3/2}$, at about 53.6 and about 54.4 eV, respectively. However, the presence of oxidation is marked for both the 5- and 55-day-old TOP-PbSe samples. Specifically, FIG. 4, parts d and f, reveal additional features, one being elemental Se ($Se^0$) at about 55.4 eV, attributed to a Se excess detected along the surface of the nanocrystals, and the other feature being oxidized Se ($Se^{4+}$) at about 58.5 eV, which is most likely due to $SeO_3^{2-}$ or $SeO_2$. The spin-orbit splitting separation values of Se $3d_{5/2}$ and Se $3d_{3/2}$ are of 0.86 eV for all PbSe samples, which is also in sync with a literature value of 0.86 eV (Se $3d_{5/2-3/2}$).

The XPS data also indicated the presence of phosphorus (P) because its inclusion in the fits of the TDP-PbSe spectra improved their quality. Elemental P is usually observed at about 130.0 eV, a contribution that partially overlaps the Pb $4f_{7/2}$ component in the right-most shoulder of FIG. 4, part a. The additional underlined presence of P—O signals along the range 130-137 eV could be attributed to a phosphate ($PO_4^{3-}$) at the lower energies and phosphorus oxides ($P_2O_5$, $P_4O_{10}$, or their combination) at higher energies. Specifically, elemental $P2p_{3/2}$ and $P2p_{1/2}$ peaks were included in the fits and the peak at 131.4 eV was attributed to the $P^+$ ion since it has been mentioned the donor ion $P^+$ should be about 1 eV higher than that of $P^0$. The P2p peak at 133.5 eV represents a second $P2p_{3/2}$ component and, lastly, the peak at 134.3 eV, attributed specifically to phosphate, was assigned to the second $P2p_{1/2}$ component. Both P2p sets possess a fixed spin-splitting of 0.8 eV, in comparison with literature value of 0.85±0.5 eV.

With (1) NMR and FTIR spectra revealing the presence of phosphorus-bound moieties, (2) XPS spectral curve fitting showing the mitigation of Pb and Se oxidation, and (3) optical data indicating long-term stability for TDP-coordinated PbSe nanocrystals, the material characterization shows that TDP-ligands provide a more effective technique through which robust and stable device behavior is achieved. Furthermore, as described below, relatively weak and dynamic bonding to the nanocrystals allows PbSe nanocrystal-to-nanocrystal atomic bonding and therefore bridges through which charge carriers can transport from dot to dot, or particle to particle. Thus, in such cases, charge transfer may involve direct dot-to-dot bonding, hopping from semiconductor-to-semiconductor (e.g., when the ligand is sufficiently small), or a combination thereof.

Further details regarding examples of solution growth of PbSe-based colloidal assemblies or arrangements, including arrangements exhibiting nanoparticle necking, are provided.

For the efficient stopping of x- and gamma-rays, the solids may be millimeters or centimeters thick. The greatest challenge of implementing roughly 5 nm diameter nanocrystals in a thick sensing solid is that the charge carriers may have to transport over millions of nanocrystals and therefore millions of interfaces. Fortunately, if one can remove or tunnel through the ligand and create a high-enough density of nanocrystals so that percolation paths are created through the solid, then charge carrier transport to the collecting electrodes can be realized. The ligands may thus, in some cases, be removed via, e.g., annealing or ligand exchange.

Self-assembly of the semiconductor nanocrystals may be facilitated by confining the formation of nanocrystal superlattices at a liquid-air interface. Specifically, upon drop-casting a colloidal solution of nanocrystals, the nanocrystals adsorb at the liquid-air interface and self-organize into large-area superlattices upon solvent evaporation. The exact structure of the superlattice which forms depends on interactions between the nanocrystals, and the interaction of the particles with the interface. This method has been expanded to form molecularly connected nanocrystal solids through a process called oriented attachment. Oriented attachment is a process that results in the self-organization and interatomic bonding of adjacent nanocrystals, the latter characteristic being useful for rapid inter-particle charge-transport. Oriented attachment may be achieved via the mutual crystallographic orientation of neighboring nanocrystals during with direct collisions or via bridging and necking of the nanocrystals, creating closely packed nanostructures and/or superlattices.

The colloidal-solid growth in the PbSe solution may include or involve a crystal growth process in which nanocrystals epitaxially bond to a nucleate, and/or an alternative process. However, TEM micrographs of PbSe show that, if the solution is highly concentrated, which can occur along the indentions of a TEM grid, then square-ordering and colloidal crystal growth is facilitated. A mechanism through which nanocrystals can be concentrated may be one alternative crystallization pathway, in which prenucleation clusters can be formed within the solution where the nanocrystal freedom-of-motion is restricted and nanocrystal-to-nanocrystal attachment becomes more favorable. When the PbSe colloidal solids are agitated in the solution, a flux of nanocrystals from the solid's surface was observed, suggesting that a similar mechanism, in which cluster formation is followed by nanocrystal interparticle bonding, may be occurring.

Figure 5:
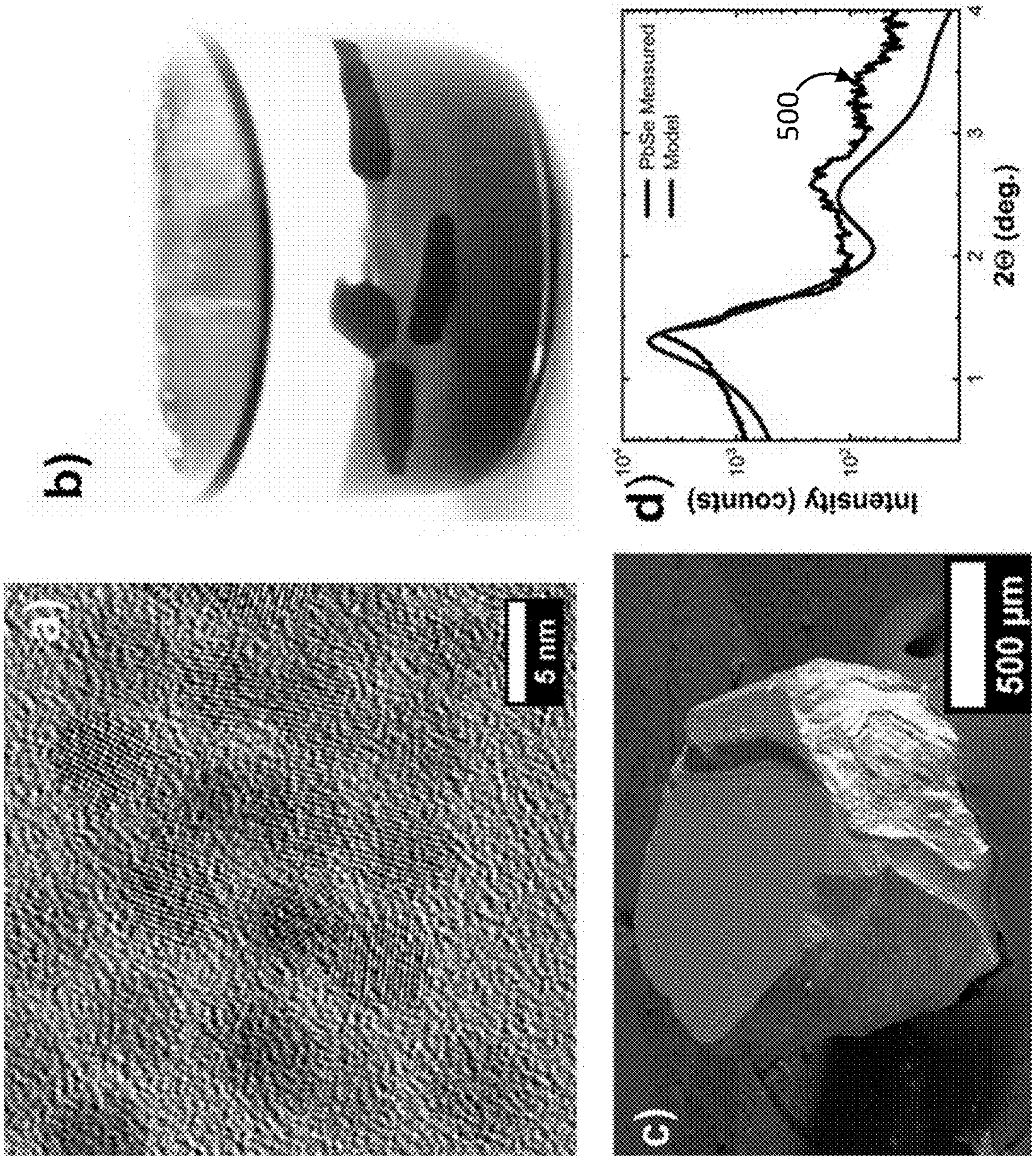

Whether the nanocrystals are formed at an interface or within a concentrated colloidal solution, the TDP-PbSe nanocrystals may form into close-packed superlattices, as shown in the TEM micrographs of FIG. 5, part a. When colloidal solutions of sufficient density (as described herein) are created, the TDP-PbSe nanocrystals form into large-scale loosely bonded clusters, as shown in FIG. 5, part b, in which some PbSe solids are accompanied by PbSe sedimentation. One can also fully incorporate the PbSe nanocrystals into the solid depending on the growth recipe. For instance, if the organic solvent (e.g., trichloroethylene (TCE), described below) is allowed to evaporate, then the mm-scale clusters solidify into mechanically colloidal solids, such as that shown in FIG. 5, part c. Although the clusters are mechanically robust enough to be readily handled with tweezers, surface damage can result from excess force. As shown in the 2D small-angle x-ray scattering (SAXS) pattern derived from solidified PbSe (curve 500 of FIG. 5, part d), there is enough structural ordering that peaks in the scattering pattern are observed. The particle and pore-size analysis derived from the (blue) modeled curve of FIG. 5, part d, indicates a nanocrystal diameter of 6.3 nm±0.8% and a particle separation of 0.9 nm. The solids exhibited a density of 3.84 $g/cm^3$ (compared to a single-crystal PbSe density of 8.77 $g/cm^3$) as measured via direct measurements of the solid's mass and volume, which is roughly consistent with the SAXS-derived volume fraction of 46.9%.

Examples of the incorporation of the above-described PbSe colloidal solid structures into high resolution x-ray and gamma-ray sensors are now described.

The sensing properties of examples of the PbSe colloidal solids can be measured by impinging both x-rays and gamma-rays upon the solid from a barium-133 ($^{133}$Ba) isotropic radioactive source.

Figure 6:
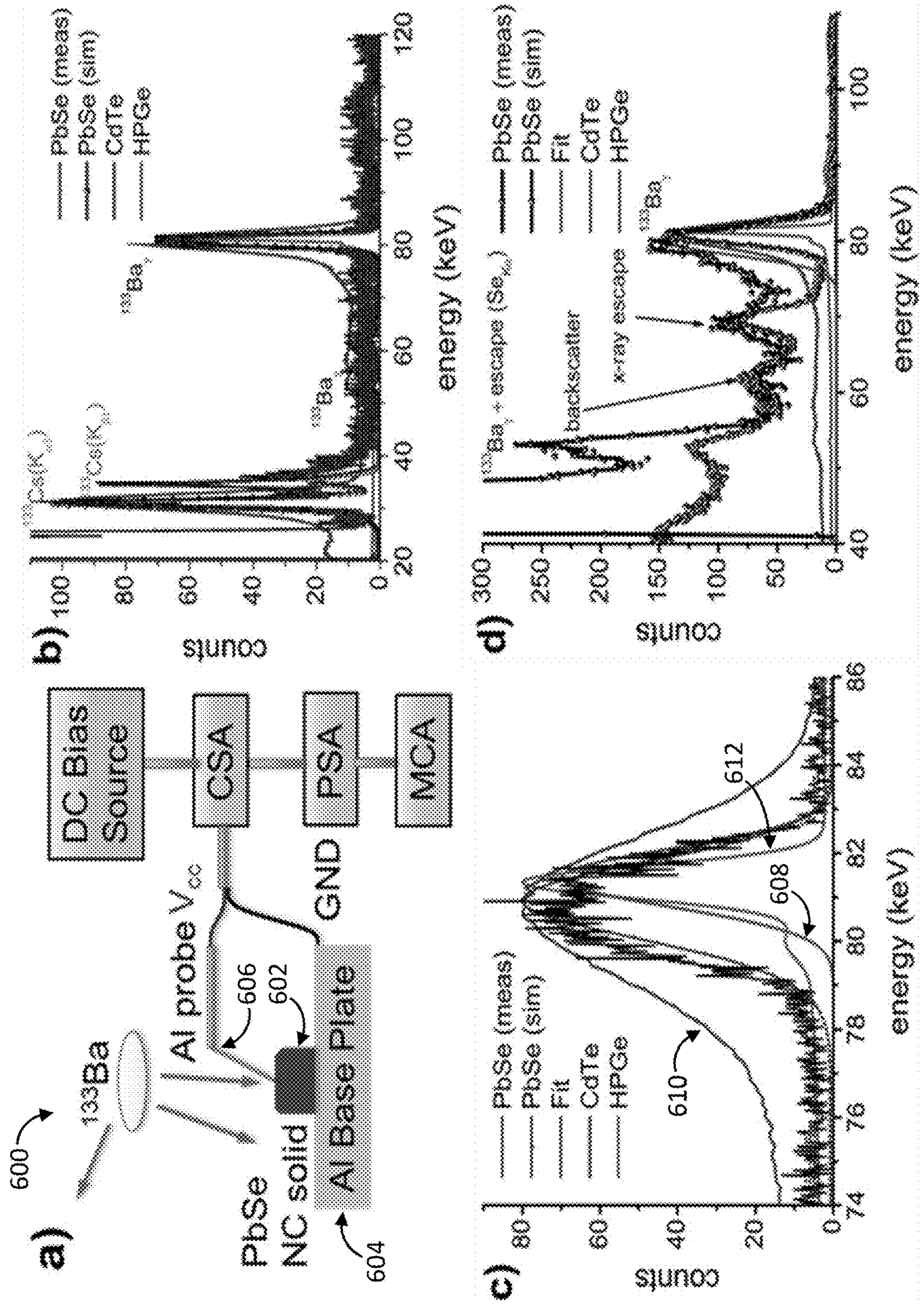

As shown in FIG. 6, part a, the example devices (e.g., device 600) included the self-assembled PbSe colloidal solids (e.g., colloidal solid 602) and two electrodes (e.g., electrodes 604, 606). In the example of FIG. 6, the colloidal solid 602 was contacted mechanically on the back-side with an aluminum plane 604, and on the top-side with a blunt aluminum probe 606. Other electrode configurations may be used. For instance, electron- and hole-transport layers and associated electrical contacts deposited via vacuum-deposition or spin-casting may be utilized. However, such contacts were not needed in order to establish excellent and uniform charge collection as revealed via the gamma-ray spectra, as follows. When the spectrum is collected with a standard experimental setup (FIG. 6, part a), FIG. 6, part b, shows that mm-scale PbSe solids can achieve fine energy resolution. Specifically, for the 1.11×1.11×0.68 $mm^3$ PbSe solid, the energy resolution, shown in fit curve 608 of FIG. 6, part c, is measured as 0.8% (0.65 keV) at 81 keV, which is superior to that of a commercial cadmium telluride (CdTe) detector (curve 610) and only slightly worse than that of HPGe, as shown in the similar widths between HPGe line 612 and the fit curve 608. The distribution of radiation-induced energy depositions within the solid is simulated with the Monte Carlo N-Particle Transport Code (MCNP) and shown in a dotted trace. Note that the MCNP simulation nicely captures the x-ray escape features that contribute to the various spectral features such as those escape features that contribute to the 81 keV peak. Furthermore, in both the simulated and measured distributions, the absence of a gamma-ray peak at 53 keV and a highly muted escape feature at about 69 keV (confluence of Se $K_\alpha$, Pb $L_\alpha$, and Pb $L_\beta$ x-ray escape from 81 keV photopeak) indicated that the entire solid is active.

One challenge of integrating lead chalcogenides into pulse-mode photon sensors is the high permittivity and thus significant detector capacitance of the device. The detector capacitance can attenuate the photo-induced pulse amplitude and temporarily expand the charge integration across the charge sensitive amplifier (CSA) used to collect the energy information. A conventional CSA, when employed as a preamplifier, is generally connected to one side of the photon detector in order to collect the induced charge generated by a radiation impact event and convert it to a voltage signal through a feedback capacitor, $C_F$, providing gain as: $V_{out}=-AQ/(C_D+(A+1)C_F)$, where Q is the induced charge, A is the CSA internal gain, and $C_D$ is the detector capacitance. If a conventional CSA is employed, then the consequence of a non-negligible detector capacitance is therefore an attenuated voltage output that can potentially be impacted by the front-end electronic noise, as can be seen from example pulses.

The diminishment in the measured energy resolution for higher capacitance PbSe nanocrystal sensors is shown in FIG. 6, part d. Specifically, a thinner sample results in a greater prominence of the x-ray escape feature at 69 keV, the backscatter peak at 62 keV (81 keV gamma-ray backscattering from the underlying aluminum and returning to be detected in the sensor's active volume), as well as the 53 keV gamma-ray peak. Moreover, the higher detector capacitance attenuates the output of the CSA such that the electronic noise is nearly as large as the amplitude from the 53 keV gamma-ray peak, as shown in the large noise curve near 50 keV. As a consequence, the resolution degrades from 0.8% to 2.3% (1.90 keV) at 81 keV. For the sensing of low-energy x-rays with a nanocrystal device, one may employ a thick (roughly nm scale) solid or employ a capacitance-insensitive CSA.

Further details regarding a method of fabricating of the disclosed detection devices are now provided in connection with a number of examples.

In some cases, the method includes synthesis of $Pb(oleate)_2$ from lead trifluoroacetate. The Pb-Oleate precursors were synthesized using the above-referenced method developed by Hendricks et al. with some modifications. In one example, lead(II) oxide (5.0 g, 22.4 mmol) and acetonitrile (10 mL, 191.5 mmol) were added to a ≥250 mL round-bottom three-neck flask. While the suspension was stirred, at least the bottom half of the flask is submerged into an ice bath for about 10 minutes, after which trifluoroacetic acid (0.35 mL, 4.48 mmol) and trifluoroacetic anhydride (3.1 mL, 22.4 mmol) were added (t of about 2-4 sec). After about 15 minutes, a yellow lead oxide dissolves, producing a clear and colorless solution that is then allowed to warm to room temperature. In parallel, oleic acid (14.2 mL, 45.03 mmol), isopropanol (90 mL, 1.18 mol) and triethylamine (7.0 mL, 50.63 mmol) were added to a 500 mL filtering (side-arm) flask and stirred vigorously for 5 minutes. The lead trifluoroacetic solution is then added to the oleic acid solution while still stirring, producing a white powdery precipitate. Next, the mixture is heated to reflux (about 85° C. or until bubbling occurs) to dissolve the precipitate at which a clear and colorless solution results (t of roughly 30 min.). The heat is then removed and the flask is allowed to cool to room temperature for >2 hours, followed by further cooling in a cylindrical dewar flask holding $LN_2$ reaching −20° C. for >2 hours. The resulting white powder was then isolated by suction filtration using a buchner funnel and filter adapter. This was done to thoroughly filtrate and wash slurry white solution with methanol (900 mL), while breaking up any large pieces by either carefully stirring or using a spatula to fracture and disassemble any aggregation. Once all were washed and de-clustered, the white powder upon the filter paper was then dried under vacuum for >6 hours in a decanter. Afterwards, the white powder was further granulated by breaking down any large clumps to become free-flowing for subsequent use. The free-flowing white powder was then stored in a nitrogen-filled glovebox.

The fabrication method may include synthesis of TDP-PbSe nanocrystals. In one example, the nanocrystals were synthesized and purified as follows. In a pre-preparation act, tris(diethylamino)phosphine (27.68 mL; 101.0 mol) and Se pellets (2.16 g; 27.4 mmol) are added to s 50 mL three-neck flask and vigorously stirred until all selenium was dissolved, resulting in the TDP-Se precursor with 1 M Se. The precursor was stored in a nitrogen-filled glovebox for later use. To synthesize the TDP-PbSe nanocrystals, dried Pb-Oleate (0.77 g), oleic acid (0.4 mL; 1.2 mmol) and 1-octadecene (5.0 mL; 15.6 mmol) were mixed in three-neck flask under $N_2$ and heated to 150° C. with vigorous stirring. Next, 3 mL of TDP-Se is rapidly injected into the Pb-oleate mixture, and the reaction continued with no interruptions for a growing time ranging from 1-5 min depending on the nanoparticle size targeted. After the growth period, the reaction was cooled to room temperature using a liquid nitrogen bath. A purification procedure proceeded by adding the nanoparticle solution to the centrifugation vial along with about 0.5 mL hexane and ≥5 mL of ethanol and centrifuging at 4.4 krpm for 5 min. The product may form a fractured black solid mass at the bottom of a vial that was isolated by decanting the supernatant. This procedure was carried out once more and placed under vacuum in a desiccator overnight.

The method also includes one or more acts directed to generating a solid structure, such as a solid seed or pellet. The transformation of a colloidal solution composed of, or otherwise including, TDP-PbSe quantum dots, to solution grown PbSe colloidal solids was carried out in an organic solvent (e.g., trichloroethylene, or TCE) disposed in closed 20 mL glass vials with a concentration of 25 mg (PbSe)/ml (TCE). Nucleation and growth of colloidal solids occurs without the addition of any destabilizing or "non-solvent" agents. The TDP-PbSe NC colloidal solution is optically opaque, but after 3-90 days (depending on the NP concentration and temperature), the aggregation of nanocrystals into distinct macroscopic clusters can be visually observed. By allowing the solvent to evaporate, the solution-grown precipitates dry into solids with rough hexagonal geometry.

The above-described solution-process method dramatically enhances the stability of PbSe nanocrystals via the use of TDPSe as the Se precursor and a refined Pb oleate. Together, the process enhances the air stability of the PbSe nanocrystals. In contrast to (a) recent reports involving a less refined Pb source for PbSe syntheses, (b) passivating PbSe NC surfaces with inorganic shells, or (c) etching out surface Se atoms, the PbSe nanocrystals maintained air stability for at least 1.6 years. The nanocrystals may be solution grown into colloidal solids with sufficiently dense nanocrystal-to-nanocrystal coupling that charge transport through the solid is facilitated. The high efficiency with which the initial photon's energy information is transformed into countable electron-hole pairs, and the effectiveness with which those charges induce a current in the solid, is reflected in the fine energy resolution that results. The results indicate that nanocrystals can be effectively employed for the sensing of high-energy quanta. For particularly penetrating neutral particles, such as high-energy gamma-rays, centimeter-thick solids may be formed. In that case, the disclosed methods may include a synthesis procedure in which millimeter-scale solids serve as seeds upon which larger colloidal solids are grown.

The disclosed devices and methods are not limited to PbSe-based colloidal arrangements and structures. Other lead chalcogenides may be used. A number of examples involving lead telluride (PbTe) and lead sulfide (PbS) are described below.

The examples involving PbTe involve gels that translate the nanostructures into structures with macroscale volumes. The gels include large spanning networks of nanoparticle chains that provide interconnectivity for a wide range of properties, including conductivity to viscoelasticity.

Figure 7:
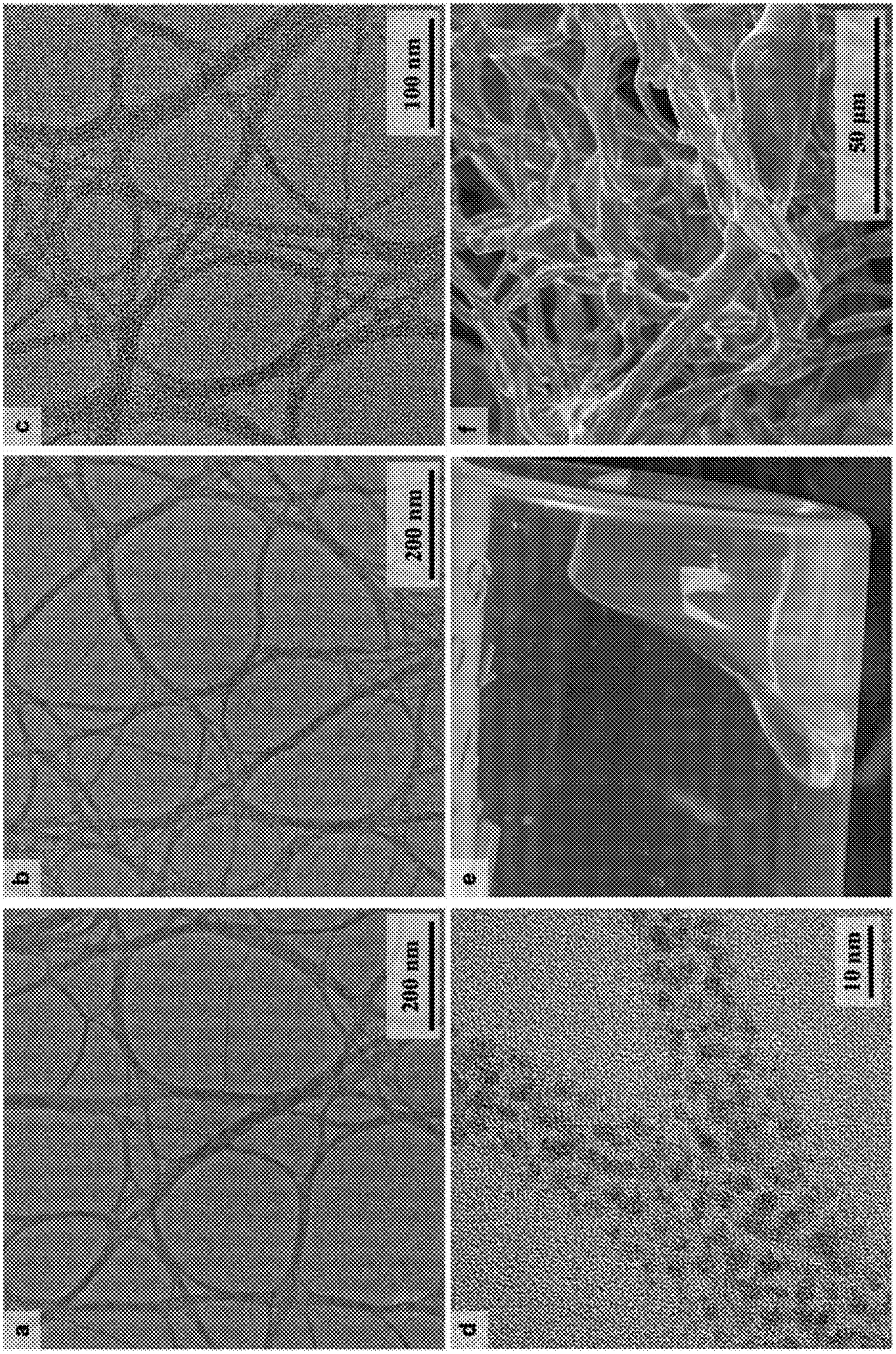

As shown in FIG. 7 and described below, citrate-stabilized lead telluride (Cit-PbTe) nanoparticles self-assemble into gels with exceptionally high porosity and low nanoparticle volume fractions. Unlike common hydrogels, aerogels, or xerogels formed from nano- and microparticles, the Cit-PbTe nanoparticles spontaneously assemble into fibrous percolating chains of hundreds or more particles. A number of different architectures of the nanoparticle gels may be realized for different concentrations and compositions of added electrolyte, as described below.

The Cit-PbTe nanoparticles may have diameters ranging from 3-5 nm. The nanoparticles self-assemble into quite unusual highly-porous and volume-spanning gels consisting of a percolating network of branching fibers (see FIG. 7, parts a-d). Spacing on the order of 1 nm between nanoparticles that include the fibers is observed in HR-TEM (see FIG. 7, part d). This suggests that the fibers are not the result of oriented attachment of the PbTe nanoparticles, but rather the result of bridging of a citrate ligand with ions. High-resolution transmission electron microscopy (HR-TEM) images reveal fibers that are 15-50 nm wide spanning across macroscopic volumes. Upon self-assembly at room temperature, freshly prepared solutions of Cit-PbTe nanoparticles form free-standing gels, demonstrating that percolating networks connect the entire volume in which the nanoparticles are contained (see FIG. 7, part e). Lyophilization or critical-point drying transforms the hydrogel monoliths into free-standing porous aerogels, preserving the fibrous morphology, suitable for characterization by scanning electron microscopy (SEM) (see FIG. 7, part f). The PbTe hydrogels prepared in these conditions swell to the full fluid volume—as opposed to phase separation or sedimentation in a sol-gel process—indicating that percolation pathways exist throughout the sample.

Selected area electron diffraction (SAED) reveals polycrystallinity of the nanoparticles. Combined with the appearance of lattice planes in HR-TEM micrographs, these findings indicate that a crystalline core is surrounded by an inorganic shell with a layer of citrate surface ligands bound to the surface.

Figure 8:
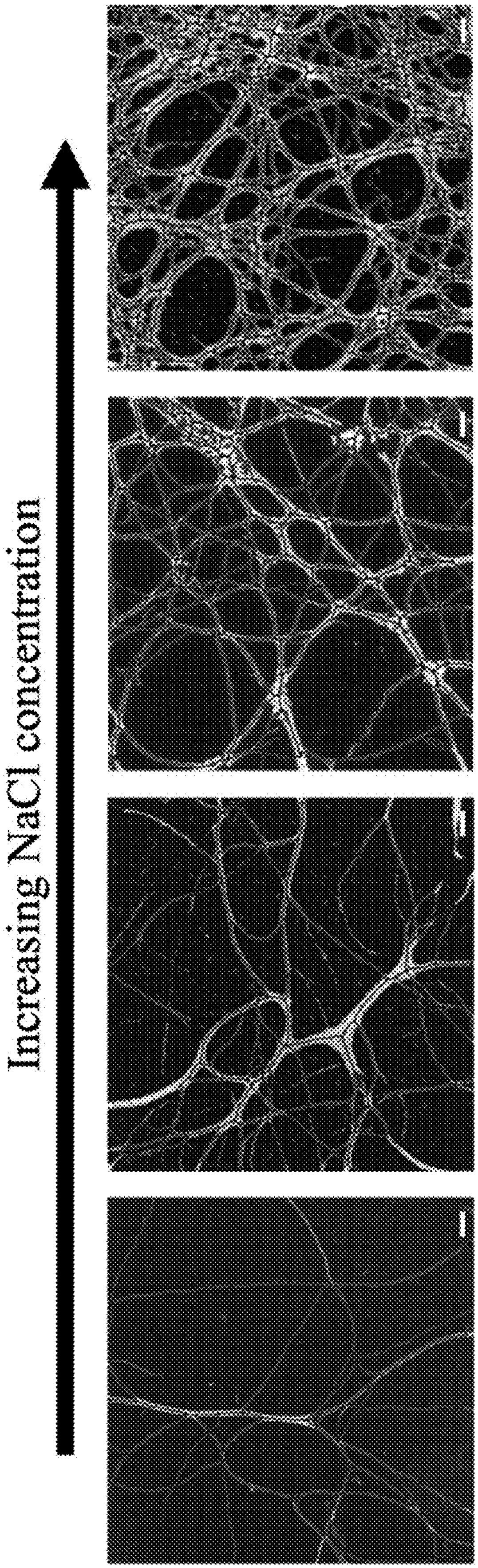
FIG. 8 depicts dark field STEM images of a number of example PbTe NP networks with varying concentrations of NaCl (0, 10, 50, and 100 mM), in which lines represent edges that map along continuous fiber segments, and dots represent nodes that lie at the intersections between continuous fiber segments (all scale bars are 100 nm).

Adding salt to the colloidal solution may be used to collapse the diffuse electrostatic double layer of the particles so that the particles come into close contact with, and adhere to each other, via van der Waals forces. STEM images were collected for PbTe gels formed under sodium chloride (NaCl) concentrations of 0, 10, 50, and 100 mM, as shown in FIG. 8.

Salts other than NaCl may be used. The cation of the added salt may be varied. For instance, KCl and CsCl may be used.

Forming PbTe nanogels with an architecture of an open extended network exhibited by the above-described examples may be useful for several reasons. One reason is their utility as a semiconducting material with a size-dependent band gap for additive manufacturing. A second reason is the decoupling of electron and hole charge populations from phononic vibrational modes. A third reason is the possibility to regulate the thermal conductivity, ion transport, phonon-electron scattering, and other properties through the PbTe network architecture using its topological characteristics as design parameters.

An example of a method of fabricating the PbTe nanogels is described below.

Cit-PbTe nanoparticles were prepared in a hydrothermal procedure. In an example synthesis, 1 mmol of $Na_2TeO_3$ was dissolved in 50 mL of E-pure water in an Erlenmeyer flask under magnetic stirring. 10 mg of $NaBH_4$ was added to the stirring flask to reduce the tellurium. Meanwhile in a separate round-bottom flask, 1 mmol of $Pb(NO_3)_2$ was added to 150 mL of E-pure water, and stirred with a magnetic stir bar until fully dissolved. 10 mmol of trisodium citrate dihydrate granules were slowly added under vigorous stirring. The solution turned cloudy white briefly, before becoming clear again. 1 m HCl was added dropwise to adjust the pH to 6.0. When the pH stabilized, the tellurium solution was pipetted into the round-bottom flask. The pH was readjusted to pH 6.0, if needed. The solution turned dark and was allowed to stir at room temperature for 10 minutes. After the 10 minutes of stirring, the flask was attached to a reflux condenser and heated at 100° C. in a silicone oil bath under reflux and stirring. The heating continued for up to a day, until the solution became transparent.

The PbTe gels were then prepared from the Cit-PbTe nanoparticles as follows. Gelation of Cit-PbTe nanoparticles occurs spontaneously, the nanoparticles self-assembling into spanning networks. After nanoparticle synthesis involving heat and agitation, the dispersion of Cit-PbTe NPs is cooled down to room temperature. During this process, the nanoparticle networks begin to self-assemble driven by the interparticle attraction. The gels can form to hold their shape at room temperature within about 2 h. Refrigeration may be used to speed up the gelation process.

Hydrogel samples were prepared by taking aliquots of fresh and hot Cit-PbTe nanoparticle dispersions, adding an amount of NaCl (or other salt), vortexing the sample for 30 seconds, and allowing the sample to remain untouched overnight on the benchtop. As the samples cooled and sat without agitation, the nanoparticles spontaneously self-assembled into hydrogels.

Hydrogel samples could form into free-standing aerogel solids by drying with lyophilization or critical-point drying. Lyophilized gels were prepared by first, freezing the hydrogel in a −80° C. freezer, then subliming out the frozen water in a Labconco FreeZone Plus 4.5 liter cascade benchtop freeze dry system. Critically-point-dried gels were prepared first by immersing the hydrogel in ethanol, and drying with a Leica EM CPD300 critical-point $CO_2$ dryer. The parameters of the drying procedure may vary.

To form a device, the resulting gels or solids may be contacted on opposite sides by, for instance, copper plates.

The above-described nanoparticle gels from PbTe present an opportunity to achieve scalable architectures of semiconducting nanoparticles with controllable percolation pathways. As described above, the hydrogels form by spontaneous self-assembly, making it possible to form a continuous gel from solution poured into a container of any shape and size, taking the form of that container.

PbTe hydrogels, however, have limited use themselves as sensors of gamma rays and other quanta. While percolation pathways are present in PbTe nanoparticle gels (NPGs), the volume fraction of nanoparticles is typically low within the gel cross-section. Concentrating gels by the removal of water may be used to improve the electrical conductivity of PbTe nanoparticle gels, so extraction of generated charge carriers is expected to be improved in the denser network gels.

Alternatives to the salt-based densification approach are described below. The alternative techniques adapt the Cit-PbTe hydrogels into a form that is dried and higher in density. The alternative techniques may be used to convert the nanoparticle gels into a suitable detector material. One approach is to control the concentration of the PbTe hydrogel so that the percolating networks are retained, but the water is removed to densify the solid. A second approach is to eschew the ligand and network altogether and convert the gel into powder, which is a common final step of sol-gel processes, and press the powder into a nanostructured pellet in that way.

In the first technique, the hydrogel may be converted into an aerogel through lyophilization or critical-point drying (CPD). Lyophilization (also referred to as freeze-drying) involves freezing the hydrogel, then subliming the frozen water out of the network under vacuum. CPD includes first replacing the absorbed water with an alternative fluid with a lesser surface tension (such as ethanol). Afterwards, liquid $CO_2$ near its critical point is cycled into a chamber containing the gel and converted to gaseous $CO_2$ to eventually remove all liquid from the gel, maintaining the network morphology without collapsing the structure from the surface tension of water on the fibers.

Figure 9:
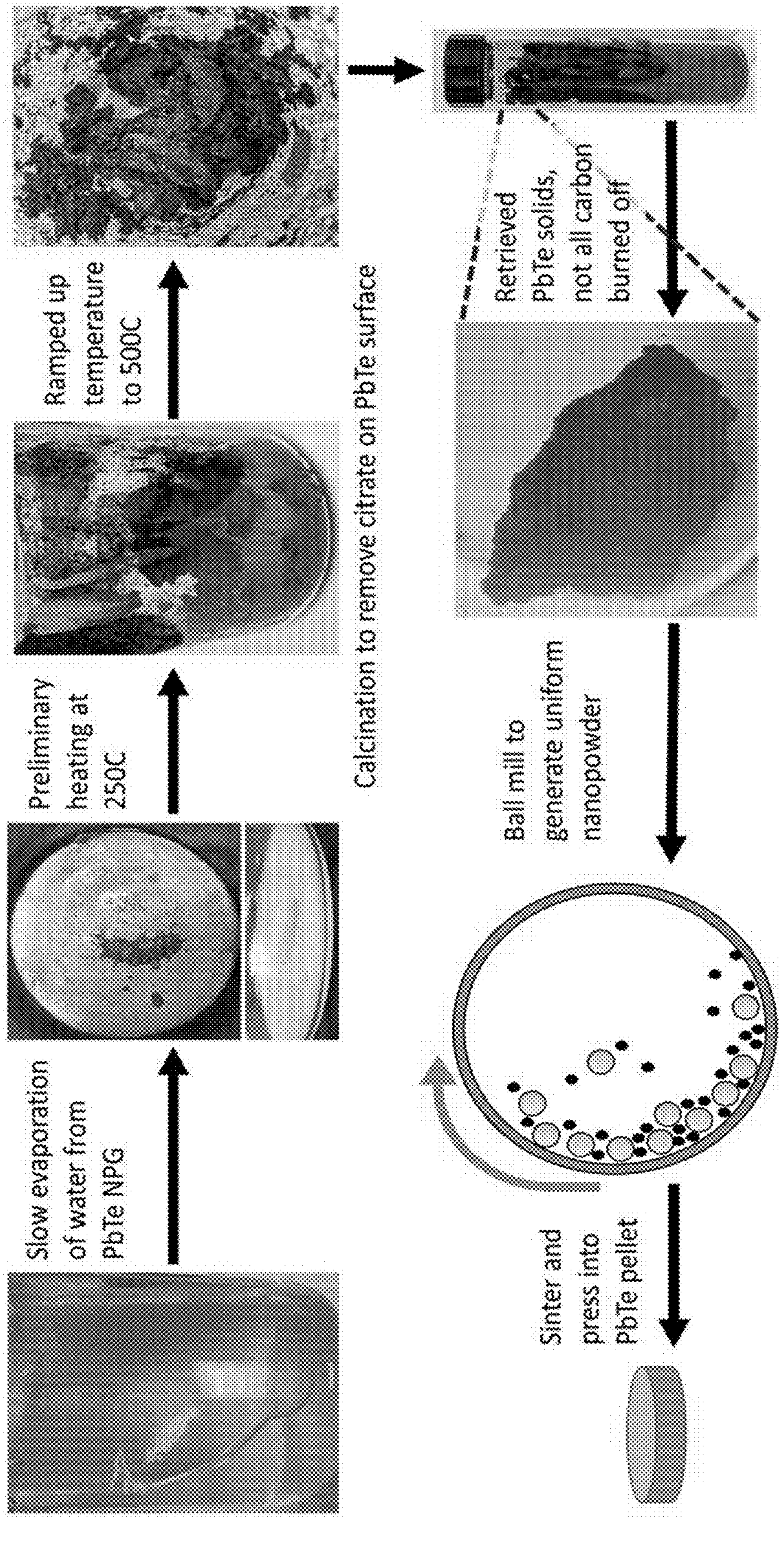
FIG. 9 is a schematic view and flow diagram of a process in which a PbTe nanoparticle gel is transformed into calcined powder and subsequently into a pressed PbTe pellet in accordance with one example.

An example of the second technique is shown in FIG. 9, which generally involves removal of the citrate ligands via heating (e.g., conversion to sodium carbonate) and washing (e.g., to dissolve the sodium carbonate). In this example, the gel is dried in a vacuum oven to produce a deposited xerogel film. Control over the xerogel morphology is not necessary, since the network will not be preserved, but boiling should be avoided. The dried film of Cit-PbTe is then heated to thermally decompose the organic citrate on the surface, in a process called calcination. For these PbTe samples, the gels are first heated to 250° C., then to 500° C. where it is held for several hours to fully decompose the surface citrate. Calcination both removes the organics on the surface that are undesirable from a detection perspective, as well as remove impurities from the PbTe particles. During calcination, the volume of the solid expanded as $CO_2$ was produced from the citrate decomposition, and the previously clear gel was converted to solid black chunks. These black chunks of solid are larger than their PbTe nanoparticle source material, so in order to pursue a nanostructured final material, the chunks were ball milled to top-down form a PbTe nanopowder. The powder was then sintered under low heat and pressure to form a solid interconnected pellet without removing the nanostructured features.

The mass of the chunks recovered from calcination was greater than the mass of the Pb and Te from their reactants, indicating citrate or its byproducts still existed in the calcined chunks. XRD indicated the presence of a significant amount of natrite, the monoclinic form of sodium carbonate ($Na_2CO_3$). This is a byproduct of the thermal decomposition of the trisodium citrate used for the ligand, and an impurity in considerable quantities that needs removal before pellet production. The sodium carbonate cannot be decomposed thermally without reaching the melting point of PbTe, which should be avoided to retain any nanoscale features than may be present in calcined chunks. The chunks may instead be purified of the sodium carbonate by a hot water wash, based on the difference in aqueous solubility between $Na_2CO_3$ and PbTe. The chunks are added to an excess volume of water at 60° C. and stirred, then insoluble powders collected by filtration. The XRD of the washed powders shows near complete removal of the natrite peaks. The PbTe powders were cold pressed to form pellets. In one example, 0.76 g of the calcined powder was pressed in a ½" dye for 1000 lbf for 1 minute, followed by 1500 lbf for 30 seconds, generating a solid pellet with a thickness of 4.07 mm.

Hydrophilic polymers may be included for mechanical reinforcement. A robust solid composed of, or otherwise including, percolating networks of PbTe nanowires is useful as a radiation detection or shielding material, and/or also as a thermoelectric material. Thermoelectric materials seek to decouple electric conductivity from thermal conductivity, which may be done in part through the use of nanowires that suppress phonon modes but allows 1 D electron transport. PbTe is additionally known for its rather high Seebeck coefficient. A percolating PbTe nanomaterial that can be produced repeatably, at scale, with mechanical properties that sufficiently prevent the fracture of the PbTe network may accordingly be applied in multiple fields.

With PbTe hydrogels, mechanical reinforcement is possible because percolating nanoparticle networks self-assemble spontaneously. By incorporating hydrophilic monomers into the Cit-PbTe nanoparticle solution, the monomers may be incorporated into the self-assembled PbTe nanoparticle gel when the hydrogel network forms. Inducing free-radical initiation then can crosslink (CL) the monomers within the hydrogel to create a second network, which imparts mechanical strength rather than semiconducting properties.

Figure 10:
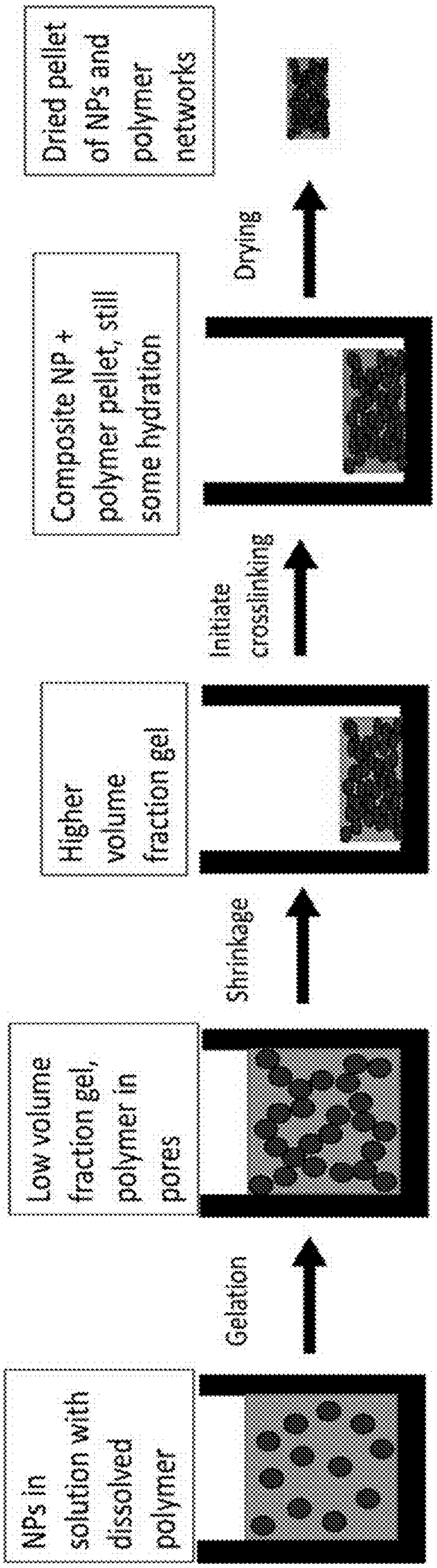
FIG. 10 is a schematic view and flow diagram of a procedure for preparing a nanocomposite gel having a combination of PbTe and a polymer in accordance with one example.

FIG. 10 displays a schematic view of a method to produce polymer-reinforced PbTe network composites in accordance with one example. Cross-linkable monomers or polymers are incorporated into an aqueous colloidal solution in addition to an initiator before hydrogel assembly. After the PbTe network is formed, the gel may be concentrated by removing water. This process occurs naturally because the PbTe network contracts and expels water over time, though the process may be sped up slightly through convection. This step is useful because the composite may have a balance between the polymers' mechanical properties and the PbTe semiconductor properties. Because the volume fraction of PbTe nanoparticles is on the order of 1%, the fraction of polymer in the composite may be on the same order as the PbTe so that the semiconductor properties are not suppressed. Because the concentration of PbTe nanoparticles cannot be effectively increased before network assembly without phase separation, only a small concentration of polymer may be added.

In order to create a composite with robust mechanical properties, the concentration of the monomer or polymer may be sufficiently high before crosslinking. To this end, a small concentration of polymer may be added to the initial solution, then concentrated by the removal of water before initiating the free-radical crosslinking. After the PbTe gel and polymer composite is crosslinked, it will still contain some amount of residual water to be dried to realize the final solid composite.

Examples of composites were prepared with 3 varieties of crosslinked polymers, which provided a variety of mechanical properties and may affect transport properties or PbTe network morphology as well. The investigated polymer systems were selected for hydrophilicity and being free-radical polymerizable (as opposed to polymerized through condensation reactions, for example).

FIG. 11, part a, displays the crosslinked polymer systems that were implemented with PbTe nanoparticle gels to form composites. Poly(ethylene glycol) diacrylate (PEGDA) represents the only mono-species system because PEGDA can crosslink on its own and represents an already polymerized version of a monomer. Several varieties of PEGDA were evaluated with different number-average molecular weights, listed as PEGDA250, PEGDA575, and PEGDA700. In brief, the greater the initial PEGDA molecular weight (and thus longer polymer chain before crosslinking) the more elastic the resulting composite, and vice versa. The other two systems included a monomer molecule with one site for free radical polymerization, and a crosslinking molecule that has two sites. These polymer systems may be varied by changing the ratio of monomer to crosslinker, but for the purposes here, the ratio was maintained at a 5 wt/wt % of crosslinker to monomer which exhibited optimal mechanical strength in a brief observation of the CL polymers in water alone (no NPs). Poly(N-isopropylacrylamide) (PNIPAm) was prepared with the crosslinker N,N-methylenebis(acrylamide) (NMBA), and Poly(2-hydroxyethyl methacrylate) (PHEMA) was prepared with the crosslinker triethylene glycol dimethacrylate (TEGDMA). As opposed to PbTe+PEGDA samples that were flexible and elastic, PbTe+PNIPAm and PbTe+PHEMA composites were mechanically rigid and hard.

The concentration of the polymer system may be varied. For instance, the concentration may be adjusted to achieve a desired balance between PbTe semiconducting properties and polymeric mechanical properties. In one example, an initial added monomer/crosslinker concentration of 2 wt % was selected, because Cit-PbTe NPs were measured to be in the range of 2-3 wt % in the initial aqueous solution. The weight percent of the inorganic phase that corresponds to high Z semiconducting material can be increased by reducing the amount of polymer added to the gel at the expense of mechanical strength and sample thickness.

Annealing the samples, e.g., at 200° C., may be implemented to thermally decompose the citrate on the surface while avoiding the decomposition of the polymer. This increases the measured weight percent of the inorganic phase, but not because the sample is actually denser or includes more PbTe, rather it gives a better measure of the relative weight ratio of semiconductor to polymer. As the relative ratio of Cit-PbTe to polymer increases, the contribution of the citrate to the total mass also increases, making thermal annealing more impactful for increased PbTe weight fractions.

The structural morphology of the PbTe+polymer composites was identified using high-resolution SEM. The key information desired from EM analysis was to confirm that 1) PbTe percolating networks were observable and not fractured or exhibiting a fundamental morphology change, and 2) observe the structure of the CL polymer and its interaction with the PbTe network.

FIG. 12 depicts an example of PbTe+1% PHEMA. The scale on which the monomer polymerized and crosslinked is a magnitude above the PbTe PNNs. Rather than a double-network structure, on the nanoscale it is more analogous to the PbTe network being completely embedded into a continuous polymer matrix. The nanoscale network of PbTe can be observed throughout the entire sample, in addition to those containing PEGDA or PNIPAM. The network of PbTe is dense with layers of assembled nanofibers thoroughly spanning and interconnected. The polymer protects the PbTe networks, ensuring that the percolating network remains unbroken and charge transport is efficient.

In designing composite materials for gamma ray attenuation, maximizing the content of high Z semiconducting materials maximizes the stopping power and improves the detector count rate. It may then be desirable to remove unnecessary low Z organics that do not contribute significantly to charge carrier generation and transportation. Thermal decomposition of the citrate surface ligands through annealing at 200° C. is possible to reduce the organic weight fraction and sinter individual nanoparticles together, as shown in FIG. 13, resulting in a gamma-ray spectrum derived from isotope Ba-133, as shown in FIG. 14. The annealing may remove or otherwise process the ligands (e.g., via motion away from particle interfaces) to avoid interruptions in the conduction paths.

Described below are examples involving the synthesis of PbS-based nanocrystals. In these cases, the synthesis of PbS nanocrystals was achieved by thermal decay of thioacetamide (TAA) in a fluid arrangement with $Pb(Ac)_2$ at a suitable initial reaction temperatures and times of reflux within the presence of the surfactant cetrimonium bromide (CTAB). In one example, 3.0 mmol (0.38 g) of $Pb(Ac)_2$ and 13.7 mmol (0.5 g) of CTAB were broken down into 13.3 mL of DIW, in a three-neck flask furnished with a condenser column. The blends were then heated to 80° C. under constant mixing. The TAA solution (1.6 mmol (0.12 g) of TAA and 10 mL of DIW) was added drop-wise, with a pressure-equalizing dropping funnel, to the above $Pb(Ac)_2$-CTAB solution while at 80° C. (initial reaction temperature), eventually getting up to the final concentrations of 0.013 mol/L $Pb(Ac)_2$ and 0.07 mol/L TAA, for a molar proportion of the $Pb(AC)_2$/TAA to be 2/3. The shade of the reaction mixture changed to black gradually in the dropwise strategy. The point at which the expansion of TAA was finished, the reaction blend was heated to 100° C. and refluxed for ≥30 min. The resulting dark samples were washed several times with water and ethanol, and afterward dried overnight at room temperature in a glove box.

The synthesis method may use different molar ratios ranging from 1/3-2/1, surfactant amounts ranging from 0.5-3.0 g, and time frames for dissolving chemicals for PbS nanocrystal fabrication all to observe changes in morphologies or potential nanostructures. In this manner, different shapes may be realized, including, for instance, star-, cubic-, and snowflake-shaped structures.

Utilizing the drop coating method, several examples were arranged for different 3D and 2D gatherings of PbS dull-tipped and truncated octahedral, small/large multipods, and star-shaped dendrites. After one 25 μL droplet was put on silicon (Si) substrates, the solutions were dried in air. PbS particles, at that point, unexpectedly embraced arranged structures of all shapes and sizes clusters with moderate solvent evaporation times Various techniques may be used to deposit the nanocrystals dispersed in a solvent onto a substrate, including, for instance, drop-casting, dip-coating, slide-casting, and spin-casting. Other techniques may be used for depositing the nanocrystals. Evaporation of the solvent then allows the individual nanocrystals to fuse together to form the macrostructure of the detector.

Described above are devices and synthesis methods that utilize nanocrystalline (NC) lead chalcogenide semiconductors (e.g., PbSe) that exhibit exploitable properties, such as tunable energy band gap and multi-exciton generation, which arise due to strong quantum confinement. The intrinsically high charge mobility combined with high atomic number and density of the lead chalcogenide materials make them useful for sensing applications with highly penetrating quanta, such as x-rays and gamma-rays. The disclosed devices and synthesis methods are capable of using these properties for each individual nanocrystallite while addressing the challenge of transporting the charge carriers throughout the active volume, a motion that can be retarded by energetic surface barriers typically in the form of insulating oxides. Surface oxidation is prevented through the fabrication of PbSe nanocrystals via tris(diethylamino)phosphine and a purified selenium precursor, a process that results in PbSe nanocrystals that are chemically and optically stable for at least 1.6 years.

In applications measuring high-energy quanta, the micrometer-scale stopping layers typical of optical photon sensors are insufficient and one must therefore find methods to interconnect the nanocrystals through millimeter- to centimeter-scale thicknesses. The disclosed synthesis methods are capable of growth of millimeter-scale PbSe colloidal solids that are directly grown within the nanocrystal solution.

In contrast to optical photon sensors that typically measure photocurrent, high-energy particle and photon sensors that measure the energy from each interacting quanta are typically hampered by the solid's thermal noise and the counting statistics associated with discretizing a single quantum into a finite number of information carriers. The disclosed devices exploit the weaker phonon-electron coupling in nanocrystalline materials to produce room temperature sensors of x-rays and gamma-rays that have comparable resolution to state-of-the-art high-purity germanium detectors. Multi-exciton generation in nanocrystals may thus be usefully employed in sensing applications that target quanta that create hot-carrier populations that are well-above the bandgap of the semiconductor materials.

The term "about" is used herein in a manner to include deviations from a specified value that would be understood by one of ordinary skill in the art to effectively be the same as the specified value due to, for instance, the absence of appreciable, detectable, or otherwise effective difference in operation, outcome, characteristic, or other aspect of the disclosed methods and devices.

The present disclosure has been described with reference to specific examples that are intended to be illustrative only and not to be limiting of the disclosure. Changes, additions and/or deletions may be made to the examples without departing from the spirit and scope of the disclosure.

The foregoing description is given for clearness of understanding only, and no unnecessary limitations should be understood therefrom.

What is claimed is:

1. A device for radiation detection, the device comprising:

a first electrode;

a second electrode spaced apart from the first electrode; and a macroscale structure disposed between the first electrode and the second electrode;

wherein:

the macroscale structure comprises a composite arrangement of nanocrystalline particles;

the nanocrystalline particles comprise a lead chalcogenide material; and the nanocrystalline particles establish conductive paths between the first electrode and the second electrode without an intervening conductive polymer agent.

2. The device of claim 1, wherein surfaces of the nanocrystalline particles are passivated by phosphorous-oxygen (P—O) moieties.

3. The device of claim 1, wherein the lead chalcogenide material is PbSe.

4. The device of claim 1, wherein the composite arrangement comprises structure directing ligands.

5. The device of claim 1, wherein adjacent nanocrystalline particles in the composite arrangement exhibit nanoparticle necking.

6. The device of claim 1, wherein the conductive paths comprise nanocrystal-to-nanocrystal atomic bonding.

7. The device of claim 1, wherein the lead chalcogenide material is PbTe.

8. The device of claim 1, wherein the lead chalcogenide material is PbS.

9. The device of claim 4, wherein the structure directing ligands comprise tris (diethylamino) phosphine (TDP) or a derivative thereof.

10. A device for radiation detection, the device comprising:

a first electrode;

a second electrode spaced apart from the first electrode; and a macroscale structure disposed between the first electrode and the second electrode;

wherein:

the macroscale structure comprises a colloidal arrangement of nanoparticles;

the nanoparticles comprise a lead chalcogenide material; and the colloidal arrangement establishes oxide-free conductive paths between the first electrode and the second electrode.

11. The device of claim 10, wherein surfaces of the nanocrystalline particles are passivated by phosphorous-oxygen (P—O) moieties.

12. The device of claim 10, wherein the lead chalcogenide material is PbSe.

13. The device of claim 10, wherein the colloidal arrangement comprises structure directing ligands.

14. The device of claim 10, wherein adjacent nanocrystalline particles in the colloidal arrangement exhibit nanoparticle necking.

15. The device of claim 10, wherein the oxide-free conductive paths comprise nanocrystal-to-nanocrystal atomic bonding.

16. The device of claim 13, wherein the structure directing ligands comprise tris (diethylamino) phosphine (TDP) or a derivative thereof.

* * * * *